(12) United States Patent
Oyanagi et al.

(10) Patent No.: US 10,950,050 B2
(45) Date of Patent: Mar. 16, 2021

(54) INFORMATION PROCESSING DEVICE, INFORMATION PROCESSING METHOD, AND PROGRAM FOR PLANNING AND EXECUTION OF WORK PLAN

(71) Applicant: Oyanagi Construction Inc., Sanjyo (JP)

(72) Inventors: Takuzo Oyanagi, Sanjyo (JP); Naotaro Oyanagi, Sanjyo (JP)

(73) Assignee: OYANAGI CONSTRUCTION INC., Sanjyo (JP)

( * ) Notice: Subject to any disclaimer, the term of this patent is extended or adjusted under 35 U.S.C. 154(b) by 0 days.

(21) Appl. No.: 16/605,660

(22) PCT Filed: Apr. 19, 2018

(86) PCT No.: PCT/JP2018/016196
§ 371 (c)(1),
(2) Date: Oct. 16, 2019

(87) PCT Pub. No.: WO2018/194137
PCT Pub. Date: Oct. 25, 2018

(65) Prior Publication Data
US 2020/0118336 A1  Apr. 16, 2020

(30) Foreign Application Priority Data

Apr. 19, 2017 (JP) .............................. JP2017-083028
Nov. 6, 2017 (JP) .............................. JP2017-214245

(51) Int. Cl.
| G06T 19/00 | (2011.01) |
| G06Q 10/06 | (2012.01) |
| G06T 15/20 | (2011.01) |

(52) U.S. Cl.
CPC ..... *G06T 19/003* (2013.01); *G06Q 10/06313* (2013.01); *G06T 15/20* (2013.01)

(58) Field of Classification Search
None
See application file for complete search history.

(56) References Cited

U.S. PATENT DOCUMENTS 9,135,752 B2  9/2015 Kutaragi et al.
2003/0052877 A1  3/2003 Schwegler, Jr. et al.
(Continued)

FOREIGN PATENT DOCUMENTS

JP   H1091057 A   4/1998
JP   H10280685 A  10/1998
(Continued)

OTHER PUBLICATIONS

Sampaio, Alcinia Z., et al. "Collaborative maintenance and construction of buildings supported on Virtual Reality technology." 6th Iberian Conference on Information Systems and Technologies (CISTI 2011). IEEE, 2011. (Year: 2011).*
(Continued)

*Primary Examiner* — Vu Nguyen
(74) *Attorney, Agent, or Firm* — Cantor Colburn LLP

(57) ABSTRACT

Enabled is support for a more efficient work plan proposal and implementation in a construction site wherien a site supervisor or site worker can identify problems prior to work execution by displaying and actually experiencing a design plan as a 3-D hologram at life size during the planning stage. The client and the contractor (the site supervisor) can intuitively comprehend the work with a time-slider function and request the necessary changes prior to the execution without having expert knowledge of construction. The client, a consultant, and the contractor can refer to the same data and debate why a design change is necessary and how to make said change. Maintenance specialists make accurate decisions Business departments and the site supervisor who are located apart communicate using the same 3-D hologram design plan while indicating areas of concern.

7 Claims, 28 Drawing Sheets

(56) References Cited

U.S. PATENT DOCUMENTS

2012/0281913 A1  11/2012  Kutaragi et al.
2018/0211205 A1* 7/2018  Takemoto ............... G06T 11/60

FOREIGN PATENT DOCUMENTS

| JP | 2001249985 A | 9/2001 |
| JP | 2002266498 A | 9/2002 |
| JP | 2011008351 A | 1/2011 |
| JP | 2017062720 A | 3/2017 |
| WO | 2011081193 A1 | 7/2011 |

OTHER PUBLICATIONS

Sampaio, Alcínia Zita, Ana R. Gomes, and Joana Prata Santos. "Management of building supported on virtual interactive models: construction planning and preventive maintenance." ITcon 17 (2012): 121-133. (Year: 2012).*

International Search Report corresponding to Application No. PCT/JP2018/016196; dated Jun. 26, 2018.

JPO Notification of Reasons for Rejection corresponding to JP Application No. 2019-513688; dated Oct. 1, 2019.

TW Notice of Reasons for Rejection corresponding to Application No. 107113800; dated Aug. 20, 2019.

Alcinia Z Sampaio et al: "Collaborative maintenance and construction of buildings supported on Virtual Reality technology", Information Systems and Technologies (CISTI), 2011 6th Iberian Conference on, IEEE, Jun. 15, 2011 (Jun. 15, 2011), pp. 1-4, XP032007322.

EPO Extended Search Report for corresponding EP Patent Application No. EP18788005.9, dated Mar. 6, 2020.

Leen-Seok Kang et al: "Application of VR Technology Linked with 4D CAD System for Construction Project", New Trends in Information and Service Science, 2009. NISS '09. International Conference On, IEEE, Piscataway, NJ, USA, Jun. 30, 2009 (Jun. 30, 2009) pp. 1058-1062, XP031531017.

* cited by examiner

FIG. 19

| USER RELATIONSHIP SENDER - RECEIVER | POSITION | HEIGHT | SOUND | OPERATION | AVATAR DISPLAY |
|---|---|---|---|---|---|
| LOCAL - LOCAL | ○ | ○ | × | ○ | × |
| REMOTE - LOCAL | ○ | ○ | ○ | ○ | ○ |
| LOCAL - REMOTE | ○ | ○ | ○ | ○ | ○ |

FIG. 24
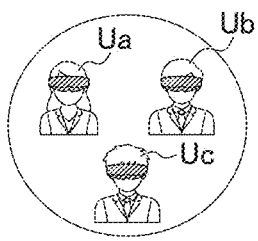
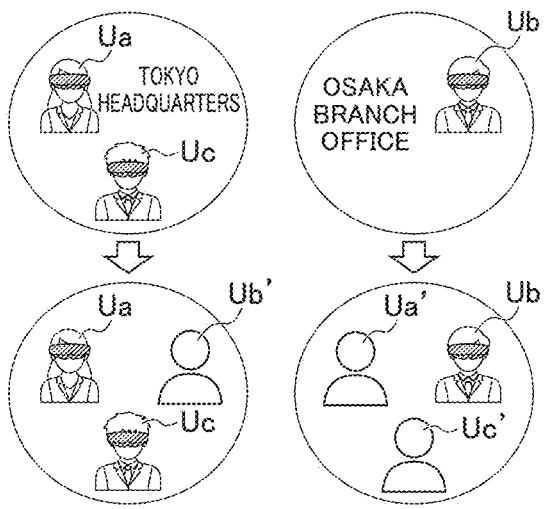
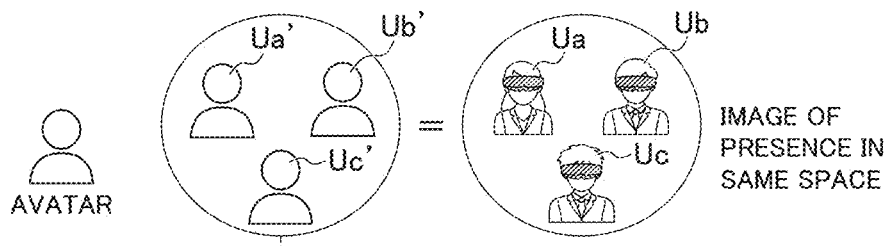
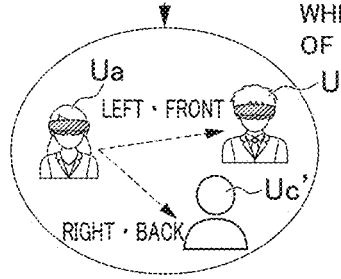

INFORMATION PROCESSING DEVICE, INFORMATION PROCESSING METHOD, AND PROGRAM FOR PLANNING AND EXECUTION OF WORK PLAN

CROSS REFERENCE TO RELATED APPLICATIONS

This is the U.S. national stage of application No. PCT/JP2018/016196, filed on Apr. 19, 2018. Priority under 35 U.S.C. § 119(a) and 35 U.S.C. § 365(b) is claimed from Japanese Patent Application No. 2017-214245, filed Nov. 6, 2017 and Japanese Patent Application No. 2017-083028, filed on Apr. 19, 2017; the disclosures of which are incorporated herein by reference.

TECHNICAL FIELD

The present invention relates to an information processing device, an information processing method, and a program.

BACKGROUND ART

Conventionally, in a construction site, the planning and execution of a work plan are very important elements, and they significantly contribute to the achievement of a construction target and the safety of workers. However, in a conventional construction site, the work plan is normally made based on a design drawing. Hence, problems are often noticed after actual work execution is started. In recent years, in order to efficiently perform a construction project, it has been necessary to perform smooth communication between persons related to the construction project such as a client, various types of consultants, and a contractor. In this respect, a construction simulation device which supports the planning of a work plan is proposed (see, for example, patent document 1).

Patent Document 1: Japanese Unexamined Patent Application, Publication No. H10-280685

DISCLOSURE OF THE INVENTION

Problems to be Solved by the Invention

However, in conventional technologies including the technology disclosed in patent document 1, the state of a construction site is simply three-dimensionally provided, and thus, for example, it is possible to merely simulate the carrying-in of construction equipment and restriction conditions on the construction equipment installed, with the result that the needs of related persons on the planning and execution of the work plan are not sufficiently satisfied.

The present invention is made in view of the conditions as described above, and an object of the present invention is to provide a technology for supporting the planning and execution of a more efficient work plan.

Means for Solving the Problems

In order to achieve the above object, an information processing device includes: an arrangement section (for example, an object arrangement unit 101 in FIG. 7) that arranges, in a three-dimensional virtual space, an object corresponding to an actual object (for example, a bridge) whose state is changed in a direction (for example, a direction of a time axis or a direction of a company axis) of at least one or more dimensions among n dimensions (n is an integer value of 2 or more);

a coordinate acquisition section (for example, in the case of the time axis, a time information acquisition unit 100 in FIG. 7) that acquires a coordinate (for example, a coordinate in the time axis is a specified time) in the dimension in which the state is changed among the n dimensions; and an image generation section (for example, a display image generation unit 105 in FIG. 7) that generates data of an image in which the object corresponding to the actual object in a state at the acquired coordinate in the dimension can be visually recognized from a predetermined viewpoint in the virtual space where the object is arranged by the arrangement section.

An information processing method and a program according to an aspect of the present invention are a method and a program which correspond to an information processing device according to an aspect of the present invention.

Effects of the Invention

According to the present invention, it is possible to provide a technology for supporting the planning and execution of a more efficient work plan in a construction site.

BRIEF DESCRIPTION OF THE DRAWINGS

FIG. 19 is a diagram showing the transmission and reception of various types of information and conditions for the arrangement of an avatar for realizing the "communication menu" in FIG. 18;

FIG. 24 is a diagram on the arrangement of avatars by the remote communication of FIG. 22 and FIG. 23;

PREFERRED MODE FOR CARRYING OUT THE INVENTION

Figure 1:
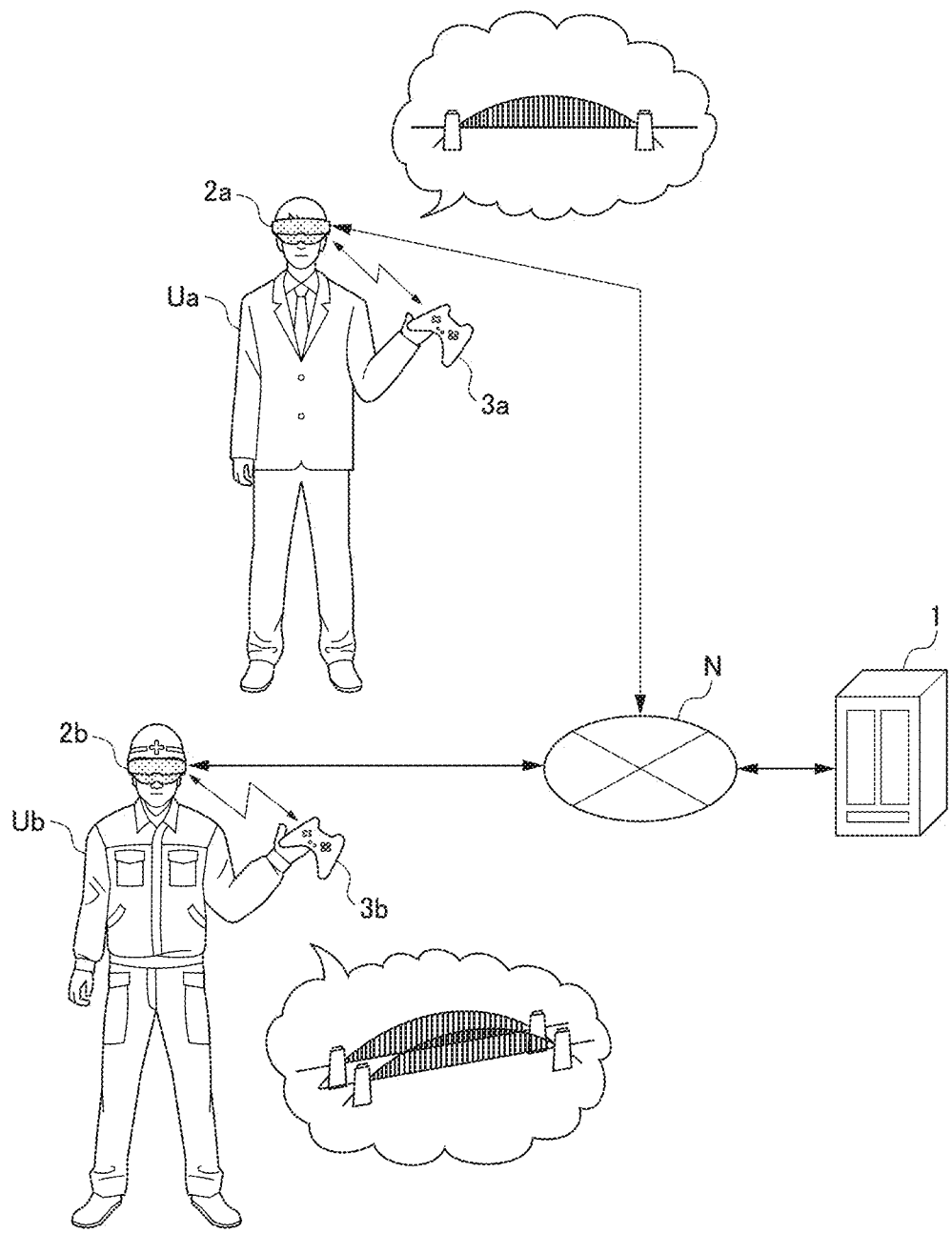
FIG. 1 is a diagram showing the configuration of an information processing system according to an embodiment of the present invention.

Embodiments of the present invention will be described below with reference to drawings. FIG. 1 is a diagram showing the configuration of an information processing system according to an embodiment of the present invention.

Before the description of the embodiments of the present invention, a service (hereinafter referred to as the "present service") that is a target to which the information processing system according to the embodiment of the present invention is applied will first be described briefly. The present service is a service as described below. Specifically, in the present service, related persons in a predetermined construction project can check various types of work execution steps while experiencing, in a simulation, the state of the work execution of a structure serving as the target of the construction project, conditions at the time of completion, and the like.

Although the present service can be provided to any number of related persons which are one or more persons, in the following discussion, for ease of description, an example is used where the present service is provided to two related persons Ua and Ub shown in FIG. 1. In the example of FIG. 1, in order to receive the provision of the present service, the related persons Ua and Ub respectively fit HMDs (Head Mounted Displays) 2a and 2b to their heads, and carry, as necessary, controllers 3a and 3b with their hands. In the following description, when it is not particularly necessary to distinguish the related persons Ua and Ub, they are collectively referred to as "related person U". When they are collectively referred to as the related person U, the HMDs 2a and 2b are collectively referred to as "HMD 2", and the controllers 3a and 3b are collectively referred to as "controller 3".

The related person U wearing the HMD 2 can experience, in a simulation, visual recognition of scenery which can be seen when the related person U is located in an actual predetermined place to face in a predetermined direction with respect to a structure (hereinafter a "bridge" is used as an example) serving as a target in a construction project, peripheral objects thereof, and the like. In other words, an image visually recognized by the related person U through the HMD 2 is equivalent to an image which is imaged, in a state where a 3D object corresponding to the actual bridge is arranged in a virtual space corresponding to an actual space, from a viewpoint in the position of the predetermined place within the virtual space in the predetermined direction. When the image is simply referred to as an "image", it includes both a "moving image" and a "still image". The image described above is not limited to a CG image (Computer Graphics image) and an AR image (Augmented Reality image), and may include an image which is obtained by actually imaging the actual space.

Here, the related person U operates the controller 3 so as to be able to provide an instruction to change a time within the virtual space. Specifically, the construction of the bridge is executed over a predetermined period. The bridge at a predetermined time within the predetermined period is in a state where it is under construction and not completed. Hence, when the related person U specifies the predetermined time, within the virtual space where a 3D object corresponding to the bridge in the state where it is under construction and not completed is arranged, an image equivalent to an image obtained by performing imaging from a viewpoint in the position of the predetermined place in the predetermined direction is visually recognized by the related person U wearing the HMD 2.

In other words, the 3D object of the bridge within the virtual space in the present service is changed with time according to the state of construction in various types of work execution steps. Hence, the related person U can visually recognize the conditions of the work execution of the bridge at an arbitrary time (in the work execution step planned or executed at the time). In other words, the related person U goes forward or back in time, on images in the conditions of the work execution of the construction site including the bridge which is planned to be constructed, and thereby can visually recognize them.

Here, the related person U moves the position of presence (actual predetermined place) within the actual space, moves his/her own head so as to change the direction (predetermined direction) of a sight line, and thereby can change the images (images visually recognized by the related person U through his/her own naked eyes) of the bridge and scenery in the periphery thereof. Likewise, the related person U wearing the HMD 2 moves, within the virtual space, the position of presence (position within the virtual space corresponding to the predetermined place within the actual space), moves his/her own head so as to change the direction (predetermined direction) of the sight line, and thereby can change the images (images visually recognized by the related person U through the HMD 2) of the bridge and scenery in the periphery thereof.

In other words, each of the related persons Ua and Ub can visually recognize, in the scenery of the construction site in a desired work execution step, the conditions (images corresponding to the conditions of the related person) of the construction site including the bridge seen when the related person faces a desired direction in a desired standing position. In this way, the related persons Ua and Ub can share the imagery of the construction site in an arbitrary work execution step, and thereby can perform smooth communication.

The information processing system of FIG. 1 to which the present service as described above is applied includes: a server 1 which is utilized by the provider of the present service; the HMD 2a and the controller 3a which are used by the related person Ua; and the HMD 2b and the controller 3b which are used by the related person Ub. The server 1, the HMD 2a, and the HMD 2b are connected to each other through a predetermined network N such as the Internet. The HMD 2a to the controller 3a and the HMD 2b to the controller 3b are respectively connected with Bluetooth (registered trademark) or the like.

Furthermore, various types of functions which can be provided by the present service will be described below with reference to FIG. 2 to FIG. 4.

Figure 2:
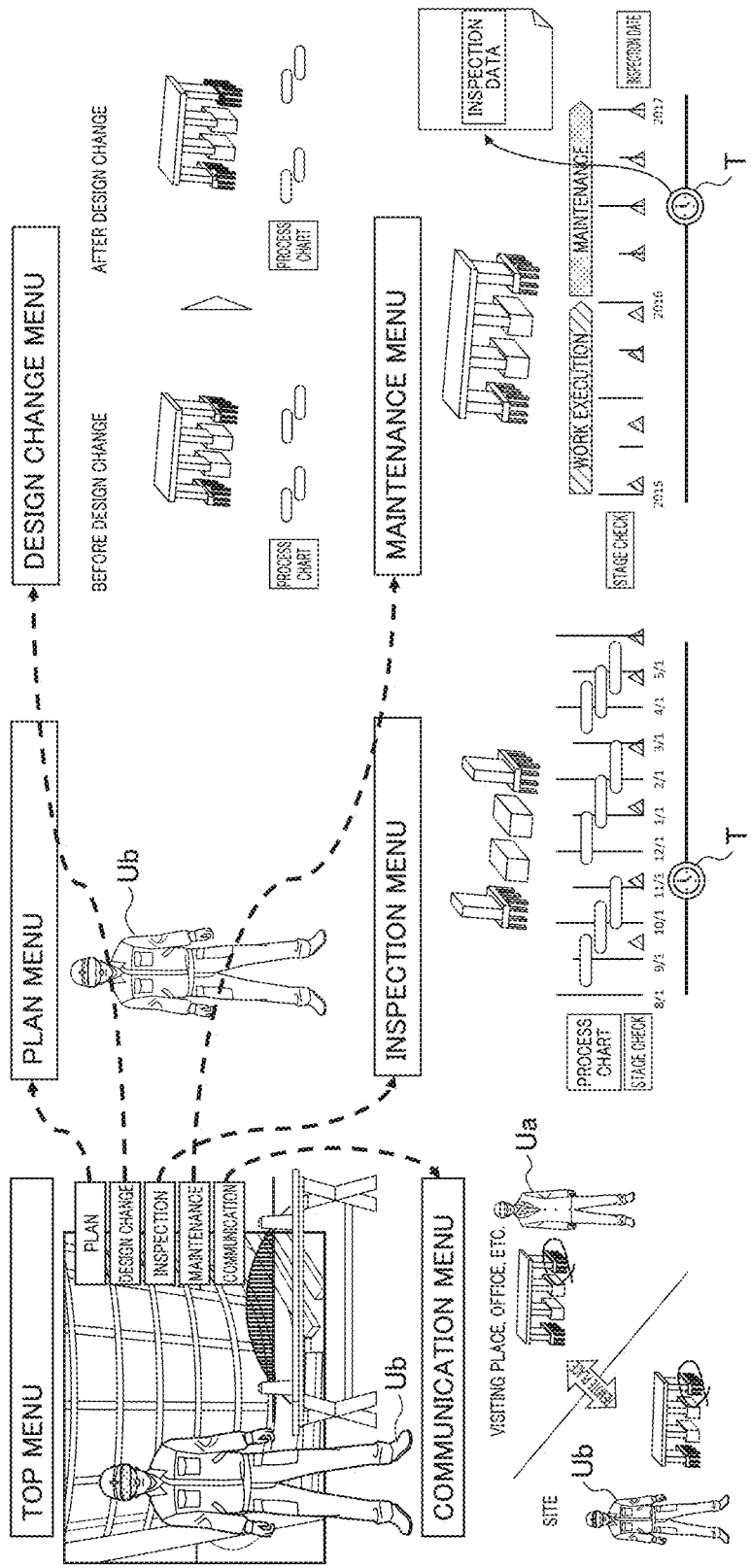
FIG. 2 is a diagram showing an example of the overall image of functions which can be realized in the information processing system of FIG. 1.

FIG. 2 is a diagram showing an example of the overall image of the functions which can be realized in the information processing system of FIG. 1.

The individual functions which can be operated or browsed by the related person U wearing the HMD 2 are provided by each of menus. In the example of FIG. 2, an example of a "Top menu" for transferring to each of the menus is indicated. As the menus to which it is possible to transfer from the "Top menu", the following five menus are prepared. Specifically, a plan menu, a design change menu, an inspection menu, a maintenance menu, and a communication menu are prepared.

Figure 3:
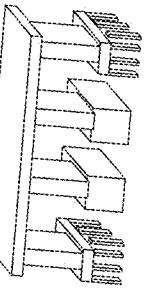
FIG. 3 is a diagram showing an example of an inspection menu which allows the provision of the present service among the menus shown in FIG. 2.
Figure 4:
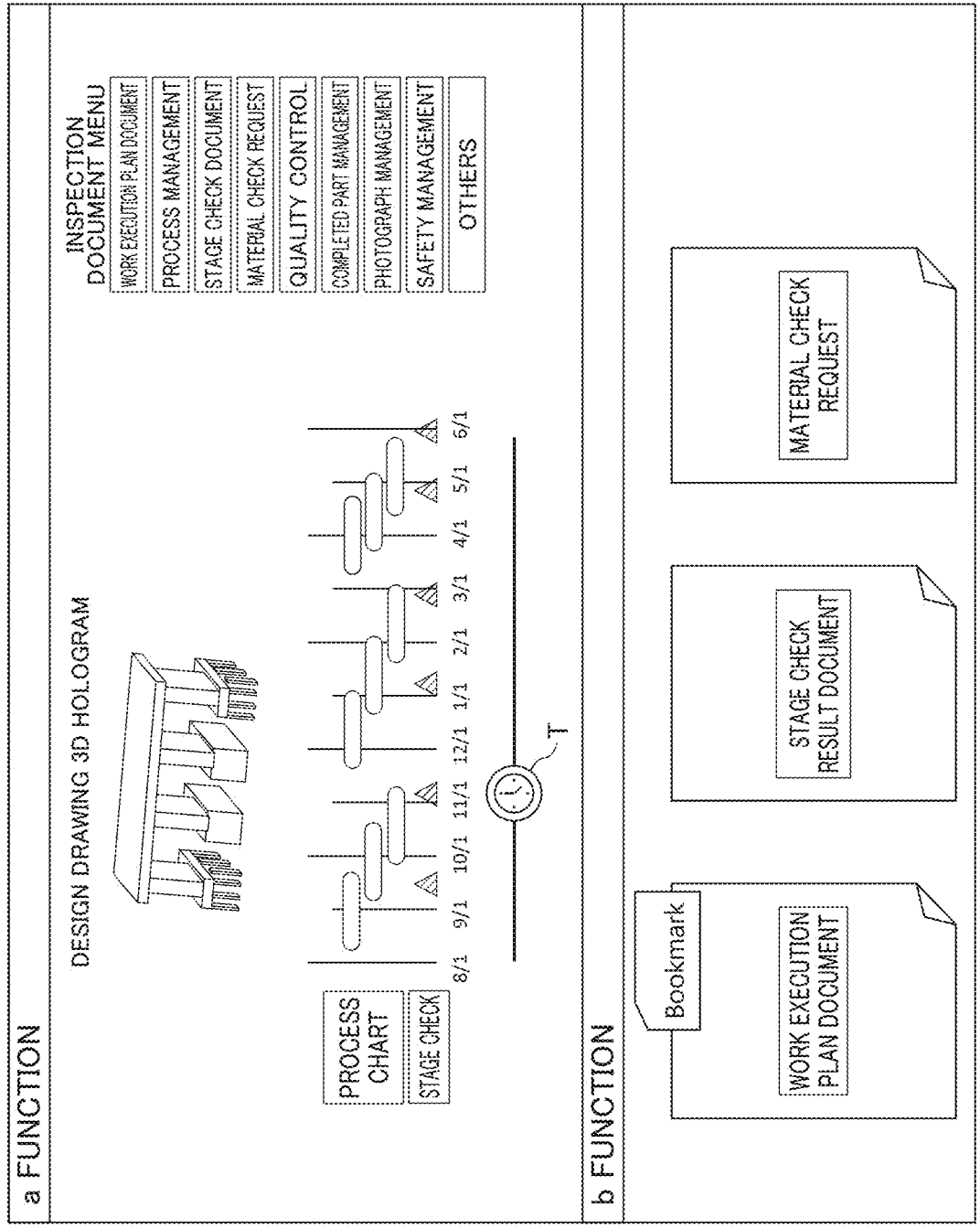
FIG. 4 is a diagram showing an example of the inspection menu which allows the provision of the present service among the menus shown in FIG. 2.

FIG. 3 and FIG. 4 are diagrams showing, among the menus shown in FIG. 2, an example of the inspection menu which allows the provision of the present service.

The related person U wearing the HMD 2 uses the controller 3 to select the inspection menu shown in FIG. 3 and FIG. 4, performs various types of operations and browsing, and thereby can easily and reliably check various types of conditions in individual work execution steps when a work execution inspection is performed. Specifically, for example, in the inspection menu, as part of the present service, a time slider (Time Slider) function is provided. The time slider function refers to a function as described below. Specifically, to each piece of 3D data of the 3D object and the like of the structure (in the present example, the bridge), a period during which the piece of 3D data is arranged within the virtual space is provided as a time attribute. Hence, the related person U wearing the HMD 2 specifies a time (time point) on a time axis in a process chart indicating the work execution steps of the structure. Then, the piece of 3D data to which the time attribute of a period including the specified time (time point) is provided is arranged within the virtual space. The related person U can visually recognize the piece of 3D data arranged within the virtual space in a desired standing position from a desired viewpoint. In other words, for the related person U, among the past, the current time, and the future within the predetermined period in the process chart, the 3D object and the like corresponding to the structure (bridge) at the time of a specified step stage appear in the virtual space of the HMD 2.

Specifically, for example, in the inspection menu, various types of functions are performed. When an a function shown in FIG. 3 is performed, a 3D object (design drawing 3D hologram) corresponding to the bridge (structure) in a completed state and an inspection document menu in which items for individually selecting various types of check documents in a completion inspection are listed are arranged within the virtual space. As the items, a work execution plan document, process management, a stage check document, a material check document, quality control, completed part management, photograph management, safety management and the like are present. The related person U selects a desired item among them so as to be able to visually recognize, within the virtual space, an inspection document (data) corresponding to the desired item.

Specifically, for example, when the item of the stage check document is selected, a b function shown in FIG. 3 is performed. Then, the 3D object (design drawing 3D hologram) corresponding to the bridge (structure) in the completed state and the inspection document menu in which the items of various types of works such as earthwork, frame construction, and earth retaining/cofferdam are listed are arranged within the virtual space. The related person U selects the item of a desired type of work among them so as to be able to visually recognize, within the virtual space, the inspection document (data) of the desired type of work. Here, the related person U can select a plurality of types of work.

Specifically, for example, when the item of the frame construction is selected, a c function shown in FIG. 3 is performed. Then, the process chart, a time slider T, and a 3D object corresponding to the bridge (structure) in a state of being under construction at a time (time point) specified by the time slider T are arranged. Here, the time slider T refers to an operator (data) which is arranged within the virtual space when the time slider function described above is performed and which specifies an arbitrary time (time point) in the predetermined period in the process chart. In the example of the c function shown in FIG. 3, the time slider T is formed with a time axis which indicates the predetermined period in the process chart and a clock icon which can be freely moved on the time axis. The position of the clock icon indicates the specified time (time point). Specifically, the related person U wearing the HMD 2 operates the controller 3 so as to move the clock icon in the time slider T, and thereby specifies the time (time point) on the time axis in the process chart. Then, the 3D object corresponding to the bridge in the state of being under construction at the specified time (time point) is arranged within the virtual space. The related person U can visually recognize the 3D data arranged within the virtual space in a desired standing position from a desired viewpoint. In other words, for the related person U, the clock icon in the time slider T is only moved, and thus the 3D object and the like corresponding to the structure (bridge) at the time of a desired step stage among the past, the current time, and the future within the predetermined period in the process chart appear in the projected space in the HMD 2.

Furthermore, a d function shown in FIG. 3 is also performed, and thus a stage check result document (data) formed with a check document, a completed part, a photograph, and the like at the time (time point) specified by the clock icon in the time slider T can also be selected from the menu of the individual items arranged in the virtual space.

Alternatively, in the inspection menu, the functions of FIG. 4 can also be performed. In the inspection menu, an a function shown in FIG. 4 may be performed. In this case, the 3D object (design drawing 3D hologram) corresponding to the bridge in the completed state, the process chart, the time slider T, and the inspection document menu are displayed within the virtual space. With the a function shown in FIG. 4, the related person U wearing the HMD 2 can perform the inspection while visually recognizing a plurality of inspection documents in a multiwindow. The related person U also operates the time slider T so as to be able to perform the time slider function as in the c function shown in FIG. 3.

Furthermore, the related person U performs the b function shown in FIG. 4 so as to be able to set a Bookmark in a specified page of the inspection document to be checked later (in the example of FIG. 4, the work execution plan document). In this way, it is possible to instantly return to the page of the Bookmark.

Figure 5:
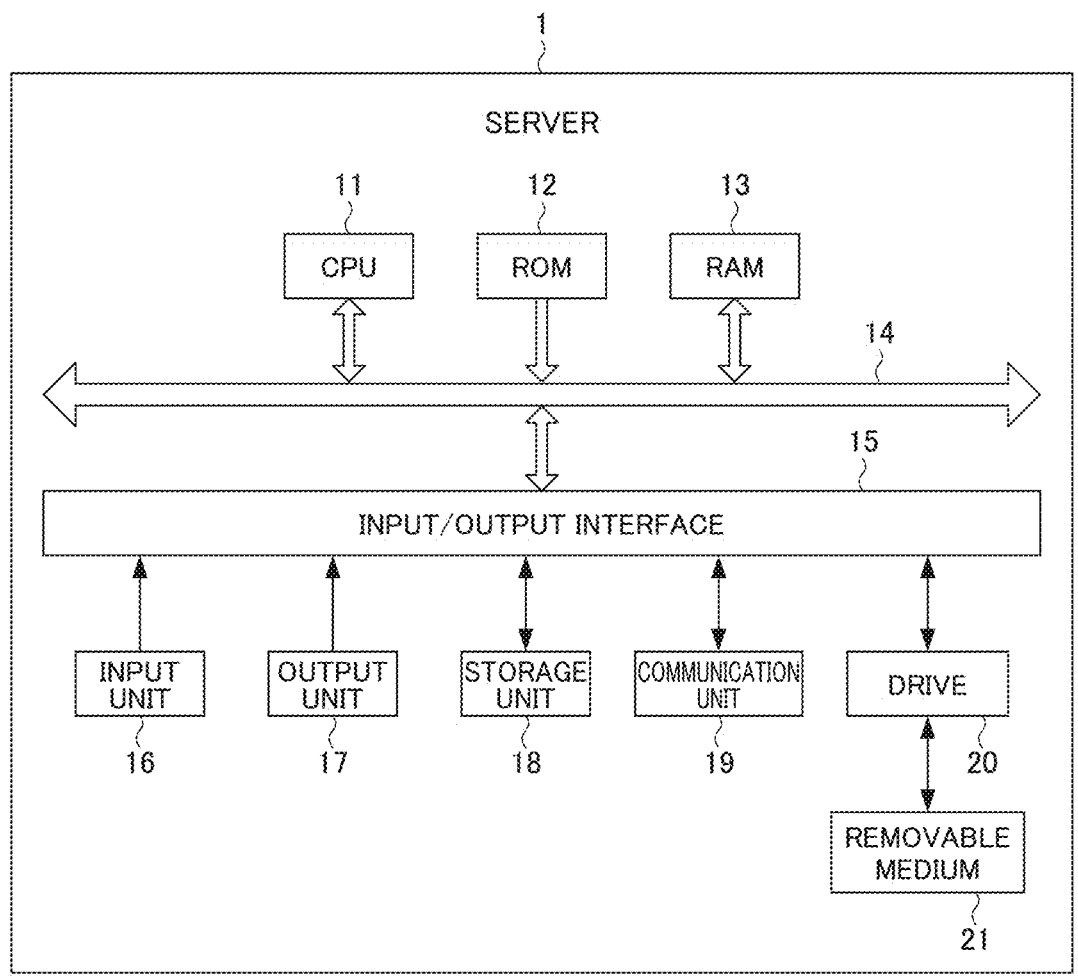
FIG. 5 is a block diagram showing an example of the hardware configuration of a server in the information processing system of FIG. 1.

The configuration and the processing of the information processing system of FIG. 1 which can perform various types of functions involving the provision of the present service will be described below with reference to FIG. 5 to FIG. 8 as necessary. FIG. 5 is a block diagram showing an example of the hardware configuration of the server in the information processing system of FIG. 1.

The server 1 includes a CPU (Central Processing Unit) 11, a ROM (Read Only Memory) 12, a RAM (Random Access Memory) 13, a bus 14, an input/output interface 15, an input unit 16, an output unit 17, a storage unit 18, a communication unit 19, a drive 20, and a removable medium 21.

The CPU 11, the ROM 12, and the RAM 13 are connected to each other through the bus 14. The input/output interface 15 is also connected to the bus 14. The input unit 16, the output unit 17, the storage unit 18, the communication unit 19, and the drive 20 are connected to the input/output interface 15. The removable medium 21 is also connected to the drive 20.

The CPU 11 executes various types of processing according to a program stored in the ROM 12 or a program loaded from the storage unit 18 to the RAM 13. In the RAM 13, data and the like necessary for executing various types of processing with the CPU 11 are stored as necessary.

The input unit 16 is formed with a keyboard, a mouse, and the like so as to input various types of information. The output unit 17 is formed with a display, speakers, and the like so as to output various types of information as images and sound.

The storage unit 18 is formed with a hard disk, a DRAM (Dynamic Random Access Memory) and the like so as to store various types of data. The communication unit 19 communicates with other devices (in the example of FIG. 1, the HMDs 2a and 2b) through the network N including the Internet.

The removable medium 21 which is formed with a magnetic disk, an optical disk, a magneto-optical disk, or a semiconductor memory is fitted to the drive 20 as necessary. A program read with the drive 20 from the removable medium 21 is installed in the storage unit 18 as necessary. The removable medium 21 can store various types of data stored in the storage unit 18 as with the storage unit 18.

Figure 6:
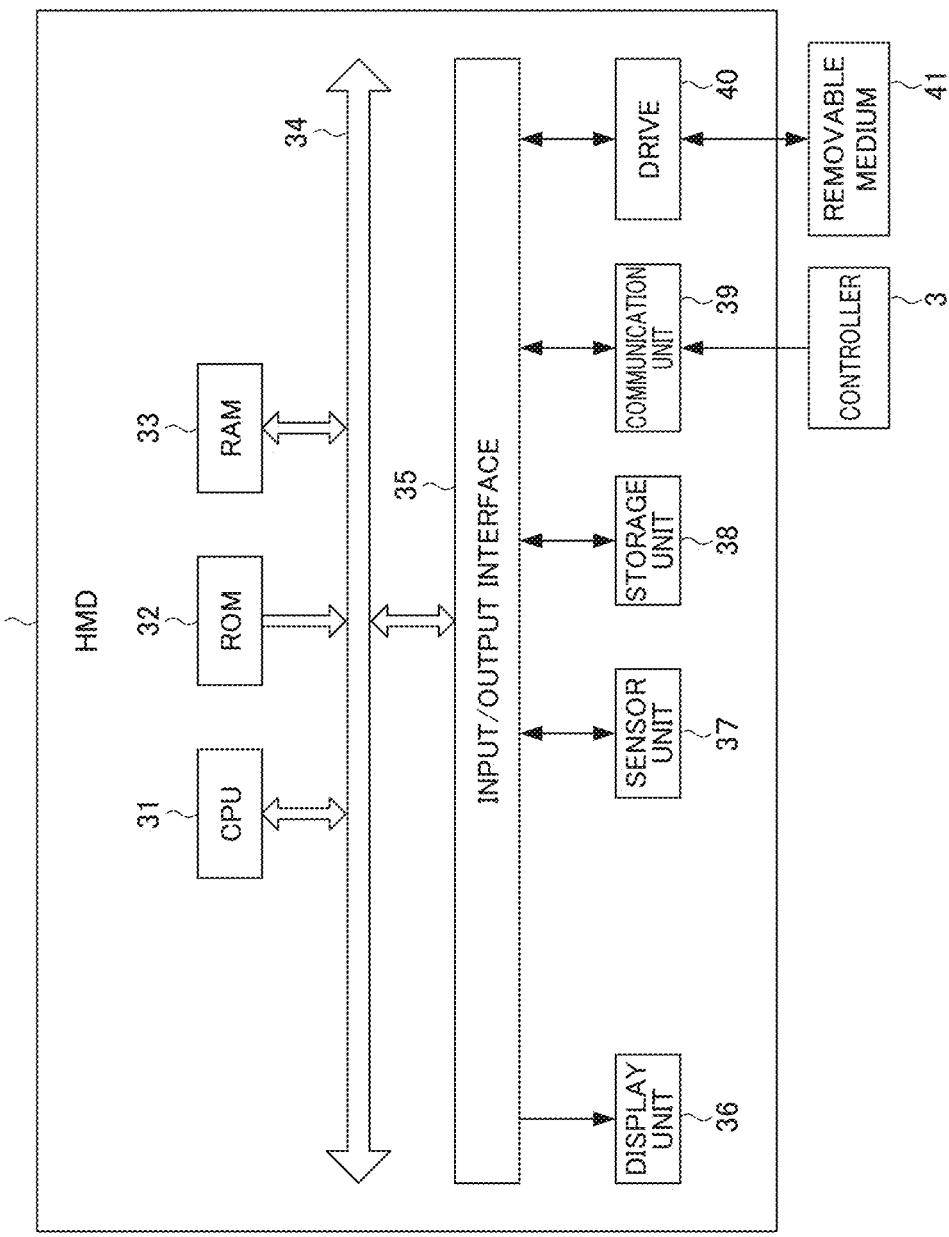
FIG. 6 is a block diagram showing an example of the hardware configuration of an HMD in the information processing system of FIG. 1.

FIG. 6 is a block diagram showing an example of the hardware configuration of the HMD in the information processing system of FIG. 1.

The HMD 2 includes a CPU 31, a ROM 32, a RAM 33, a bus 34, an input/output interface 35, a display unit 36, a sensor unit 37, a storage unit 38, a communication unit 39, and a drive 40.

The description of the same configurations as those of the server 1 in FIG. 5 will be omitted here, and only differences from the server 1 will be described below.

The display unit 36 is formed with various types of liquid crystal displays or the like so as to project and display the 3D object (3D monogram) of the structure (such as the bridge), an operation menu, and the like within the virtual space. The sensor unit 37 is formed with various types of sensors such as an inclination sensor, an acceleration sensor, an angular velocity sensor, and the like. The detection information of the sensor unit 37 is utilized as, for example, various types of detection information on an angle (direction) within the virtual space.

The communication unit 39 communicates with other devices (in the example of FIG. 1, the server 1 or the other controller 3) through the network N and also communicates with the controller 3 by a predetermined wireless communication method. The controller 3 is an input device which receives, when various types of processing are executed with the CPU 31 of the HMD 2, instruction operations by the related person U such as for a menu selection, a viewpoint operation, and the time (time point) in the time slider function. Although in the present embodiment, the controller 3 is used for ease of description, the controller 3 is not particularly an essential element for the information processing system. Alternatively, for example, motion sensors may be provided around the related person U such that various types of instruction operations are performed by various types of gesture motions of the related person U.

Figure 7:
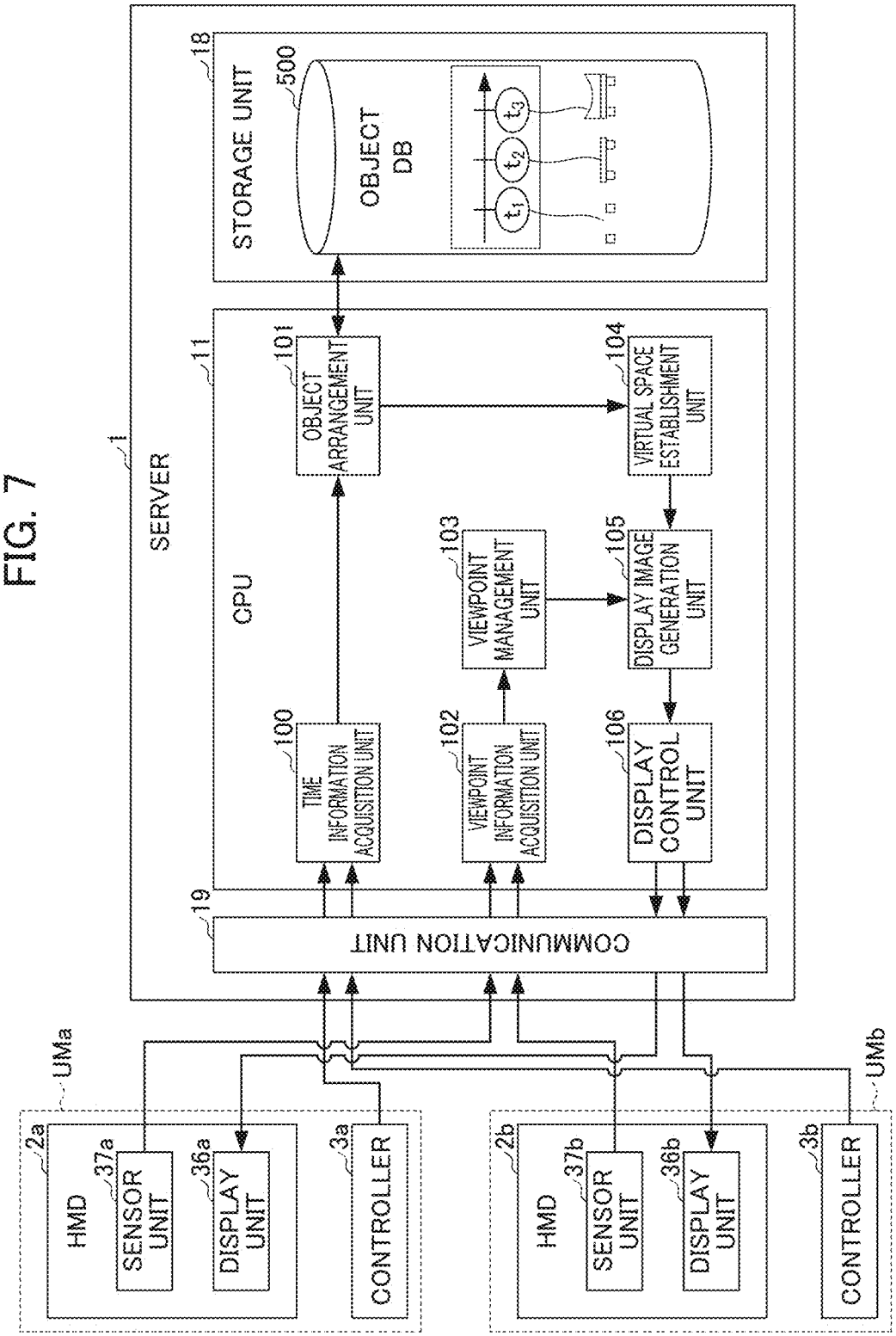
FIG. 7 shows functional blocks indicating an example of a functional configuration for realizing display image generation processing among the functional configurations of the server of FIG. 5 and the HMD of FIG. 6.

By the cooperation of the various types of hardware of the server 1, the HMD 2, and the controller 3 as described above and various types of software, the time slider function can be performed. The time slider function is performed, and thus the information processing system acquires, as a coordinate in the time axis, a predetermined time within time information related to a work execution process and indicated in the process chart, arranges, within the virtual space, a 3D object corresponding to an actual object (structure such as a bridge) in a construction site at the coordinate, and thereby can generate the data of a display image which can be visually recognized in a predetermined position from a predetermined viewpoint within the virtual space. A series of processing steps after the time slider function as described above is performed to generate the data of the display image until the data is presented to the related person U (is visually recognized by the related person U) are referred to as "display image generation processing" in the following description. In other words, the server 1, the HMD 2, and the controller 3 have a functional configuration as shown in FIG. 7 when the display image generation processing is performed. FIG. 7 shows functional blocks indicating an example of the functional configuration for realizing the display image generation processing among the functional configurations of the server of FIG. 5 and the HMD of FIG. 6.

As shown in FIG. 7, when in the CPU 11 of the server 1, the display image generation processing is performed, a time information acquisition unit 100, an object arrangement unit 101, a viewpoint information acquisition unit 102, a viewpoint management unit 103, a virtual space establishment unit 104, a display image generation unit 105, and a display control unit 106 function. In one region of the storage unit 18 of the server 1, an object DB 500 is provided. Furthermore, although not shown in the figure, a DB in which the data of the stage check result document, the inspection documents displayed in the multiwindow, and various types of other documents is stored is provided in the storage unit 18. As described above and later, the data of various types of documents described above can also be naturally arranged within the virtual space and included in the display image so as to be presented to the related person U. However, in the description up to FIG. 8, for ease of description, only the 3D object such as the structure (bridge) is assumed to be arranged within the virtual space. Here, the HMD 2a and the controller 3a which are used by the related person Ua are collectively referred to as the UMa, and the HMD 2b and the controller 3b which are used by the related person Ub are collectively referred to as the UMb. The details of the functional blocks from the time information acquisition unit 100 to the display control unit 106 will be randomly described below.

The virtual space establishment unit 104 of the server 1 establishes the virtual space for arranging the 3D object of the structure (bridge) and the like.

Although not shown in FIG. 7, the time slider T (FIG. 3 and the like) described above is arranged in the virtual space established by the virtual space establishment unit 104. Hence, the related person U operates the controller 3 so as to move, on the time axis, the clock icon of the time slider (time slider displayed in the display unit 36) in the virtual space, and thereby indicates a predetermined time. The time information acquisition unit 100 of the server 1 acquires, through the communication unit 19, information (hereinafter referred to as "time information") indicating the time indicated by the related person U in this way. Here, when a plurality of related persons U are present, individual pieces of time information may be the same as or different from each other. When the individual pieces of time information are the same as each other, for example, a master user (for example, the related person Ua) and a subordinate user (for example, the related person Ub) are determined in advance, and thus the time information acquisition unit 100 acquires, as the time information, information indicating the specified time from the controller 3 of the master user.

The object arrangement unit 101 of the server 1 extracts, from the object DB 500, based on the time information acquired from the time information acquisition unit 100, a 3D object corresponding to the actual object (structure such as the bridge) in a state of being under construction or after construction at the specified time (time point) and arranges the 3D object in the virtual space. In FIG. 7, in order for the present invention to be easily understood, the 3D objects of the bridge in individual states of being under construction are drawn as if they were made to correspond to times t1 to t3 and stored in the object DB 500. However, in actuality, as will be described later in FIG. 9 and FIG. 10, the individual parts of the structure and the like are divided in units of layers and stored in the object DB 500 such that each of the layers is made to correspond not to one point of time on the time axis but to a time (period having a constant width on the time axis) present within the virtual space.

The viewpoint information acquisition unit 102 of the server 1 makes the communication unit 19 receive the detection information of the sensor unit 37 in the HMD 2 of the related person U and the information of the instruction operation from the controller 3, and acquires, based on the information thereof, information (hereinafter referred to as "viewpoint information") indicating the position of arrangement of the viewpoint and the direction of the viewpoint within the virtual space. Here, when a plurality of related persons U are present, pieces of viewpoint information may be the same as or different from each other. However, in terms of providing experience in a simulation, it is suitable that the pieces of viewpoint information are different for each of the related persons U. Hence, the viewpoint management unit 103 manages pieces of viewpoint information for each of the related persons U (in the example of FIG. 7, the related persons Ua and Ub). The direction of the viewpoint does not necessarily need to extend from the outside (appearance) of the 3D object toward the 3D object with respect to the 3D object such as the bridge and may extend from, for example, the inside (the interior of the structure) of the object. In this way, for example, it is possible to check the state of the interior of the actual object (structure) which cannot be visually recognized in actuality by humans as the work execution proceeds. In other words, the viewpoint information can have omnidirectional characteristics. Furthermore, for example, for any one of a 3D object obtained by shrinking a large actual object within the virtual space, an actual-size 3D object of the actual object (structure), and a 3D object obtained by further enlarging the actual object, viewpoint information which indicates a sight line extending from an arbitrary position in an arbitrary direction can be generated. In this way, the related person U such as a construction worker can perform a work simulation within the virtual space in advance. In other words, the viewpoint information can have expandability or shrinkability with respect to a target to be visually recognized (3D object).

In the virtual space in which the 3D object corresponding to the actual object (structure such as the bridge) in the state of being under construction or in the state after construction at the time (time specified by the related person U) indicated by the time information, the display image generation unit 105 generates, as the data of the display image, the data of an image that can be seen from the viewpoint indicated by the viewpoint information.

The display control unit 106 transmits, through the communication unit 19, the data of the display image generated in the display image generation unit 105 so as to perform control for displaying the display image in the display unit 36 of the HMD 2 of the related person U.

Figure 8:
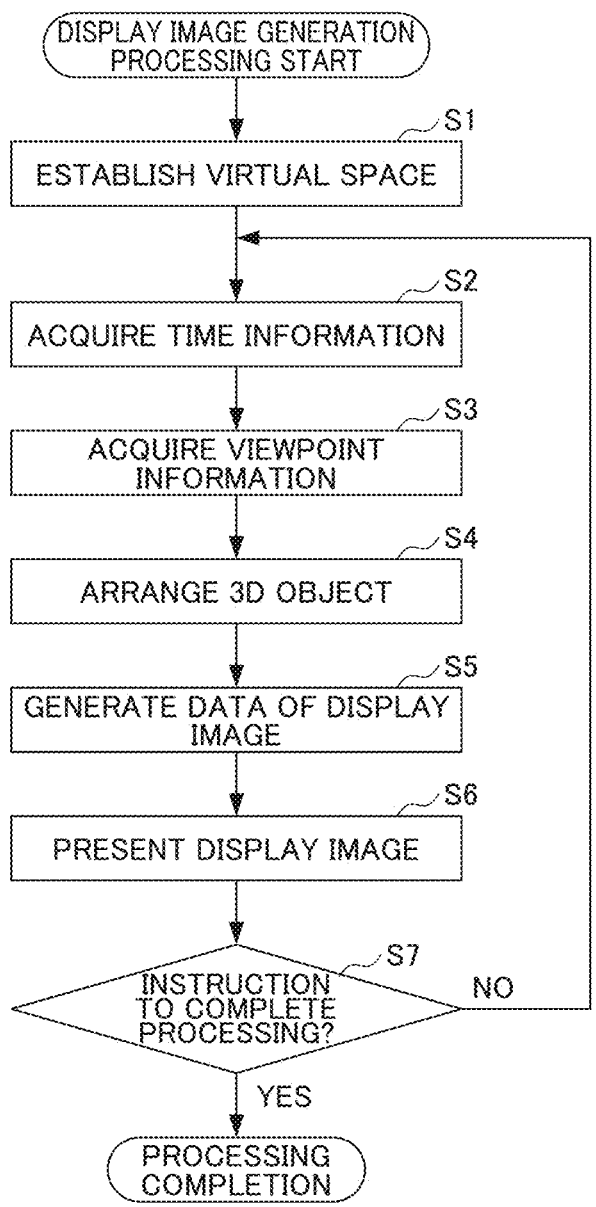
FIG. 8 is a flowchart illustrating the flow of the display image generation processing which is performed with the server of FIG. 5.

The display image generation processing performed by the server 1 of FIG. 5 will be described next with reference to FIG. 8. Specifically, FIG. 8 is a flowchart which illustrates the flow of the display image generation processing on the server side of FIG. 5.

In step S1, the virtual space establishment unit 104 establishes the virtual space. In step S2, the time information acquisition unit 100 acquires the time information indicating the time indicated by the related person U. In step S3, the viewpoint information acquisition unit 102 acquires the viewpoint information indicating the position of arrangement of the viewpoint and the direction of the viewpoint within the virtual space. In step S4, the object arrangement unit 101 arranges, in the virtual space, based on the time information acquired in the processing of step S2, the 3D object corresponding to the actual object (structure such as the bridge) in the state of being under construction or in the state after construction at the specified time (time point). In step S5, the display image generation unit 105 generates, as the data of the display image, in the virtual space in which the 3D object is arranged in the processing of step S4, the data of the image that can be seen from the viewpoint indicated by the viewpoint information acquired in the processing of step S3. In step S6, the display control unit 106 transmits, through the communication unit 19, the data of the display image generated in the processing of step S5 so as to present the display image to the related person U.

In step S7, the server 1 determines whether or not an instruction to complete the processing was provided. Although the instruction to complete the processing is not particularly limited, for example, a configuration can be adopted in which the instruction to complete the processing is transmitted from the HMD 2. When the instruction to complete the processing is not transmitted from the HMD 2, the determination in step S7 is no, and thus the processing is returned to step S2 with the result that the subsequent processing is repeated. By contrast, when the instruction to complete the processing is transmitted from the HMD 2, the determination in step S7 is yes, and thus the display image generation processing is completed.

Although the embodiment of the present invention has been described above, the present invention is not limited to the embodiment described above, and as long as the object of the present invention can be achieved, variations, modifications, and the like are included in the present invention.

Here, in the first embodiment described above, the example is adopted and described where the time information (for example, the predetermined time) and the predetermined 3D object (for example, scenery which can be visually recognized by the related person U at a predetermined time from a predetermined standing position and a predetermined angle) are associated with each other, and thus the 3D object and the like in the virtual space that can be visually recognized by the related person U are determined. However, various types of layers forming the 3D object described above and the like may be associated with the time information (for example, a predetermined period) such that the 3D object in the virtual space which can be visually recognized by the related person U, document data, images, and other data are determined. A method of processing data forming the time slider function in a second embodiment which adopts a processing method different from that in the first embodiment described above will be described below. The layer refers to the minimum unit, such as the "3D object (including a 3D hologram)", "document data", or the like, which forms various types of information that can be arranged in the virtual space, and the layer is, for example, an iron bridge part of the bridge.

Figure 9:
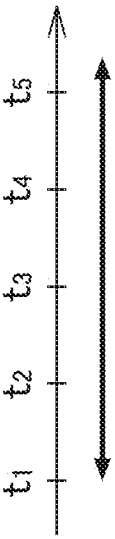
FIG. 9 is a diagram showing various types of information stored in an object DB in the server/HMD of FIG. 7 and is a diagram showing an example different from FIG. 7.

FIG. 9 is a diagram showing various types of information stored in the object DB 500 of the server/HMD in FIG. 7 and is a diagram showing an example different from that in FIG. 7. In the example of FIG. 9, layers b1 to b5 are associated with the time information (predetermined periods), and the information thereof is stored in the object DB 500. Here, the predetermined period indicates, for example, a constant period from a time t1 to a time t5 and does not indicate one time point such as the time t1.

When the first row of the table in FIG. 9 is seen, information on the layer b1 is displayed. The layer b1 is, for example, one leg of the bridge which is planned to be constructed. A period from the time t1 to the time t5 is specified for the layer b1. Specifically, at the time t1, the layer b1 is displayed in the virtual space as part of the bridge which is planned to be constructed and is still displayed in the virtual space even at the time t5. On the other hand, when the fifth row of the table is seen, information on the layer b5 is displayed. The layer b5 is, for example, "scaffolding" which is utilized by workers in a construction site. The layer b5 specifies a period from the time t2 to the time t4. Specifically, at the time t2, the layer b5 is displayed in the virtual space as the scaffolding for construction, and at the time t4, that is, at the time of the completion of the bridge, the layer b5 is not displayed. This is because in an actual construction site, at the stage in which the bridge is completed, the scaffolding is completely removed.

Figure 10:
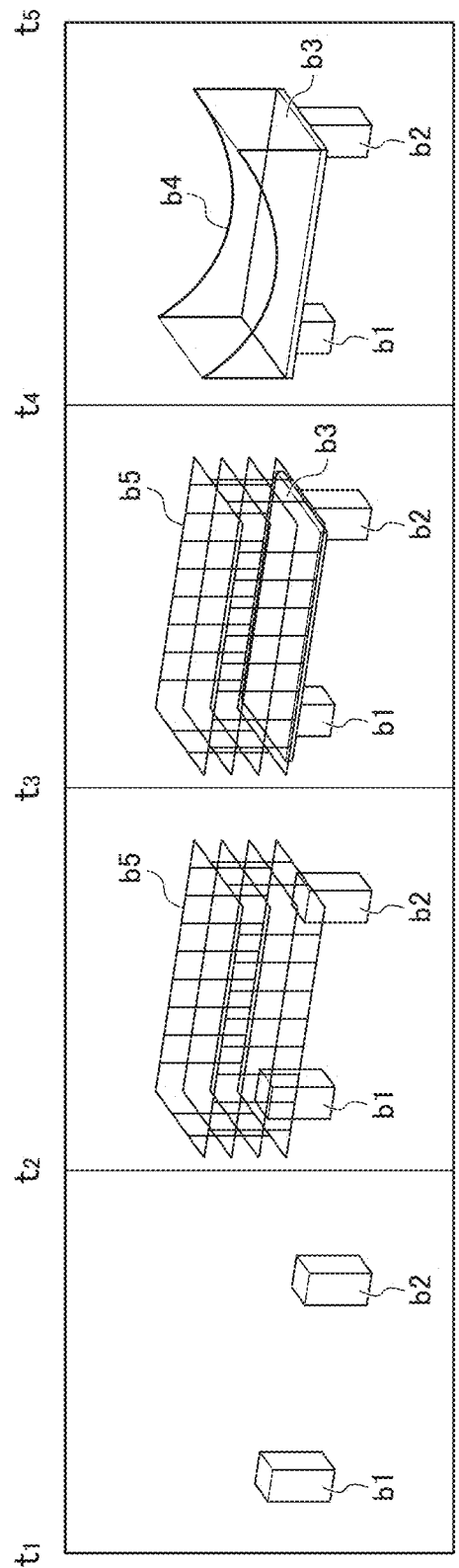
FIG. 10 is a diagram for illustrating a relationship with layers displayed in individual periods.

A relationship between various types of information stored in the object DB 500 described above and the time slider function will be briefly described next with reference to FIG. 10. FIG. 10 is a diagram for illustrating a relationship with the layers displayed in the individual periods.

When FIG. 10 is seen, images displayed for the related person U in the individual periods from the time t1 to the time t2, from the time t2 to the time t3, from the time t3 to the time t4, and from the time t4 to the time t5 are displayed. For example, in the period from the time t1 to the time t2, each of the layers b1 and b2 is displayed singly. Specifically, it is indicated that in a construction step in the period from the time t1 to the time t2, only the leg parts of the bridge are planned to be constructed. When the related person U wants to check the conditions of the construction in the period from the time t1 to the time t2, the related person U selects the image of the construction site in the period so as to be able to display the image. In this respect, with reference to FIG. 9, as described above, for example, the layer b5 (scaffolding for construction) is normally utilized only while under construction and is removed at the time of completion. When FIG. 10 is seen, the layer b5 is displayed only in the periods from the time t2 to the time t3 and from the time t3 and the time t4. In other words, it is meant that the layer b5 is installed at the time t2 and is removed at the time t4.

As described above, when the first embodiment described above and the second embodiment shown in FIG. 9 and FIG. 10 are summarized, the related person U utilizes, for example, the time slider function described above so as to be able to perform the followings. Specifically, the related person U can visually recognize the 3D object which is planned to be constructed in an "arbitrarily specified time axis", and hence, in other words, the related person U can freely go back and forward to (slide to) the past and the future. Furthermore, for example, the related person U can slide the time axis (time slider) in a longitudinal direction on the time axis (time line) in a lateral direction, and can visually recognize the image (or the image in the construction site) of the 3D object which is planned to be constructed in an arbitrary time axis (for example, a period).

Here, a difference between the conventional technology and the time slider function in the first and second embodiments described above is as follows. Specifically, conventionally, when the image of the 3D object which is planned to be constructed and the like is displayed, data at a predetermined time (time point) is normally processed so as to be displayed. By contrast, in the time slider function, it is also possible to perform processing and display such that the time axis in each of the layers serves as a line (period), and thus the time slider function has, as the time attribute, coupling and continuity.

When the time slider function in the first and second embodiments described above is summarized, it can be summarized as follows. Specifically,
  (1) in the conventional technology, for each layer, only one time point (for example, the latest time point) can be defined as the time attribute whereas, for each layer, the time axis (for example, a period) can be defined as the time attribute,
  (2) since, for each layer, the time axis (period) can be defined, it is possible to establish three-dimensional data in an arbitrarily specified time axis without producing 3D data every arbitrary specified time point,
  (3) each layer established as described in (2) can be displayed in a display medium (for example, the display unit 36 of FIG. 6),
  (4) it is possible to process four-dimensional data (space information+time information) which can freely slide in time with the arbitrary time axis specified in (2), (5) the four-dimensional information (space information+time information) processed in (4) can be displayed in the display medium (for example, the display unit 36 of FIGS. 6), and (6) it can also be further associated with two-dimensional data (for example, document data) or the like and be displayed.

In the first and second embodiments described above, the description is given by adopting an inspection function as an example of the basic function which can be realized in the information processing system. However, as described previously with reference to FIG. 2, the "Top menu" for transferring to each of the menus is present. As the menus to which it is possible to transfer from the "Top menu", the following five menus are prepared. Specifically, the plan menu, the design change menu, the inspection menu, the maintenance menu, and the communication menu are prepared.

Although in the embodiments described above, the information processing system which can perform the time slider function is described, the functions that the information processing system to which the present invention is applied can perform are not limited to this function. Specifically, although in the embodiments described above, the direction of change of the virtual space is the direction of the time axis, there is no limitation to this configuration, and an arbitrary direction of the axis can be adopted. For example, an axis (hereinafter referred to as a "company axis") which indicates individual companies is defined, and the individual companies can be made to correspond to individual coordinates in the company axis. When the related person U can arbitrarily specify each of the coordinates in the company axis, the related person U can visually recognize the 3D object of a structure such as a bridge which is constructed by the company indicated at the specified coordinate. In other words, for example, when in a competition of a plurality of companies, a company in charge of constructing a structure such as a bridge is determined, it is possible to compare structures such as bridges which are designed by the companies that participate in the competition. Furthermore, the number of axes which the related person U can specify is not limited to one, and the related person U can also specify a plurality of axes. For example, when two axes of the company axis and the time axis can be specified, the related person U can compare, in each work execution step, individual states of being under construction among a plurality of companies.

In other words, as long as the information processing device to which the present invention is applied has the following configuration, the information processing device can have various embodiments. Specifically, the information processing device to which the present invention is applied includes:

an arrangement section (for example, the object arrangement unit 101 of FIG. 7) that arranges, in a three-dimensional virtual space, a 3D object corresponding to an actual object (for example, a bridge) whose state is changed in a direction (for example, the direction of the time axis or the direction of the company axis) of at least one or more dimensions among n dimensions (n is an integer value of 2 or more);

a coordinate acquisition section (for example, the time information acquisition unit 100 of FIG. 7 in the case of the time axis) that acquires a coordinate (for example, the coordinate in the time axis is the specified time) in the dimension in which the state is changed among the n dimensions; and an image generation section (for example, the display image generation unit 105 of FIG. 7) that generates data of an image in which the 3D object corresponding to the actual object in a state at the acquired coordinate in the dimension can be visually recognized from a predetermined viewpoint in the virtual space where the 3D object is arranged by the arrangement section.

In this way, it is possible to expect that the related person U can intuitively understand work execution steps even when the related person U is not familiar with a construction project.

Here, in the first and second embodiments described above, the description is given by adopting the inspection function as the example of the basic function which can be realized in the information processing system according to the embodiment of the present invention. However, as described with reference to FIG. 2, as the basic functions which can be realized in the information processing system according to the embodiment of the present invention, for example, the "Top menu", the "plan menu", the "design change menu", the "communication menu", and the "maintenance menu" can also be adopted. The individual functions which can be adopted by the provider of the present service will be described below with reference to FIG. 11 to FIG. 25.

Figure 11:
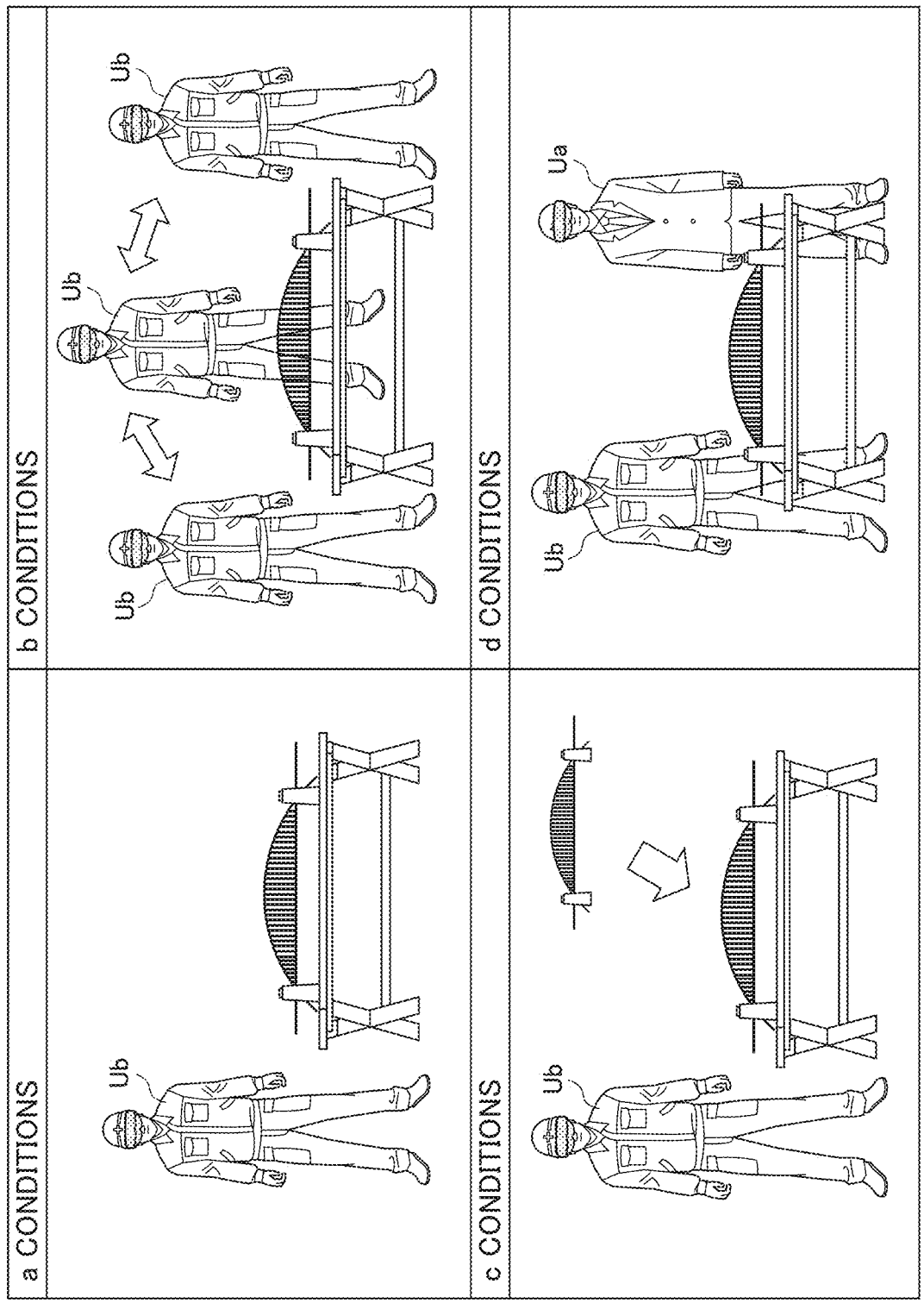
FIG. 11 is a diagram showing an example of basic functions which can be realized in the information processing system of FIG. 1.

FIG. 11 is a diagram showing an example of the basic functions which can be realized in the information processing system of FIG. 1 and is specifically a diagram showing an example of a case where the "Top menu" shown in FIG. 2 is adopted among the basic functions which can be realized in the information processing system according to the embodiment of the present invention. The "Top menu" refers to, for example, the initial screen of an object (which is also referred to as a 3D model) which is displayed in the virtual space.

In a conditions shown in FIG. 11, a configuration is formed with the related person U, who is a beneficiary of the present service, and a structure (for example, a bridge) that is planned to be constructed. In other words, the related person Ub can visually recognize, in the virtual space, as a 3D object, the structure which is planned to be constructed. In addition to the 3D object of the structure which is planned to be constructed, the related person Ub may be allowed to project, for example, a forklift or the like utilized in construction as a support object which is not a detection target. In b conditions shown in FIG. 11, an example of a case where the related person Ub moves to the left or right of the bridge is indicated. Specifically, the related person Ub moves by him/herself so as to change a standing position for visual recognition, and thereby can visually recognize the structure planned to be constructed from various distances and various angles. In other words, when the related person Ub wants to move within the construction site, more exactly, when the related person Ub wants to move within the virtual space corresponding to the construction site, the related person Ub actually moves by him/herself, and thus the sensor unit 37 of the HMD 2*b* shown in FIG. 6 detects the information thereof, with the result that it is possible to change the standing position within the virtual space. On the other hand, in c conditions shown in FIG. 11, the structure planned to be constructed may be moved to a position which is easy to see so as to be displayed without the related person Ub moving by him/herself. In other words, unlike the case of the b conditions shown in FIG. 11, in addition to the case where the related person Ub moves by him/herself so as to change the standing position, the related person Ub moves the structure itself to an arbitrary place so as to display the structure without moving by him/herself, and thereby can visually recognize the structure in various work stages from various distances and various angles so as to check the structure. In the present embodiment, the related person Ub can visually recognize, while operating the controller 3b to specify the work execution step, scenery (a photograph obtained by shooting the scenery) of the construction site including the structure planned to be constructed which can be seen when the related person Ub faces toward a desired direction in a desired standing position. However, the related person Ub does not necessarily need to use the controller 3b to determine the "standing position" and the "direction of a sight line (predetermined direction)". For example, the sensor unit 37 of the HMD 2b may detect the movement of the related person Ub so as to determine the "standing position" of the related person Ub and the "direction of the sight line (predetermined direction)". Furthermore, in d conditions shown in FIG. 11, an example of a case where a plurality of related persons visually recognize the structure planned to be constructed is indicated. In other words, as indicated in the d conditions shown in FIG. 11, the related persons Ua and Ub can visually recognize the same structure planned to be constructed. However, the related persons Ua and Ub do not need to select the structure planned to be constructed in the same time axis. In other words, the related persons Ua and Ub may individually select the structure planned to be constructed in different work stages so as to be able to visually recognize the structure. Furthermore, the related persons Ua and Ub do not need to select the same structure planned to be constructed. In other words, for example, the related person Ua may visually recognize a different structure (such as a different bridge) planned to be constructed.

Figure 12:
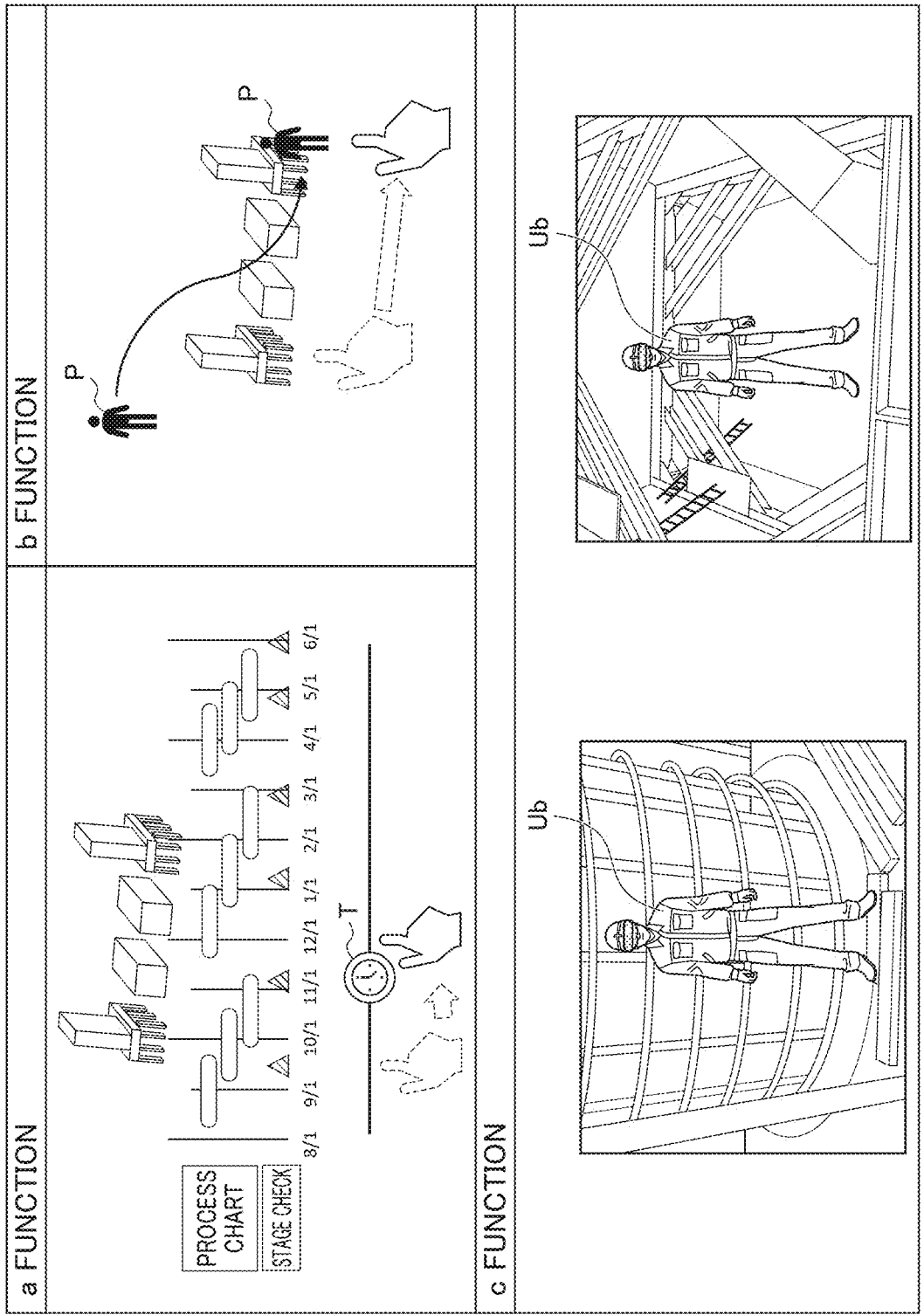
FIG. 12 is a diagram showing an example of a plan menu (1/2) among the functions which can be realized in the information processing system of FIG. 1.
Figure 13:
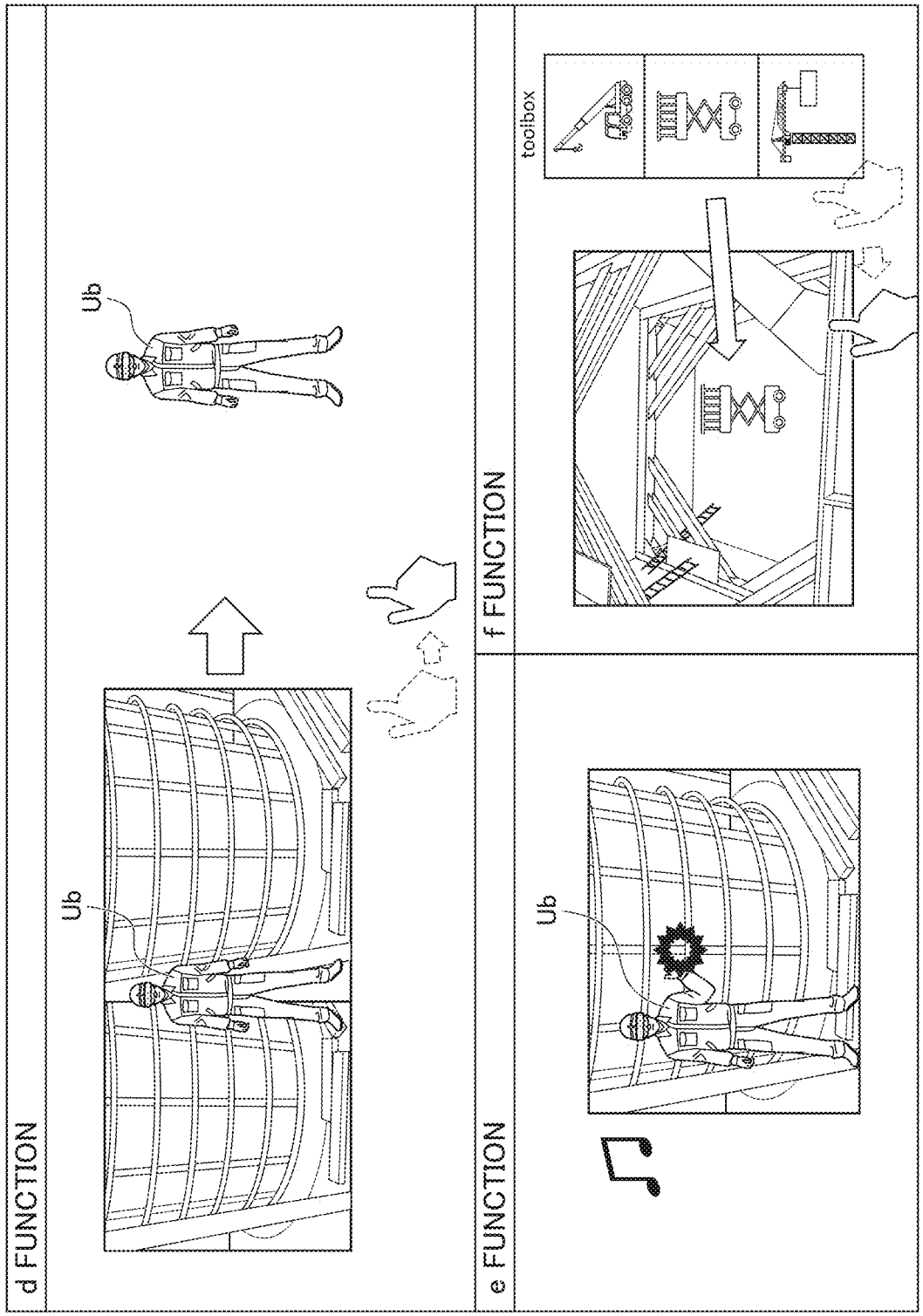
FIG. 13 is a diagram showing the example of the plan menu (2/2) among the functions which can be realized in the information processing system of FIG. 1.

FIG. 12 and FIG. 13 are diagrams showing an example of the basic functions which can be realized in the information processing system of FIG. 1 and, specifically, are diagrams showing an example of a case where the "plan menu" is adopted among the basic functions which can be realized in the information processing system according to the embodiment of the present invention.

An a function shown in FIG. 12 indicates an example of a display image when an image on the time slider T function is displayed for the unillustrated related person (for example, the related person U). In other words, the unillustrated related person (for example, the related person U) can check and select the conditions of the work execution from the time slider function. Specifically, for example, in the example of the a function shown in FIG. 12, the unillustrated related person U selects a work execution date T of "November 1st". Then, the unillustrated related person U can check the structure corresponding to the work execution stage selected in the time slider T planned to be constructed, the process chart, the work execution plan and the like as well as the work execution plan document and the like thereon. Then, in the example of the a function shown in FIG. 12, the conditions of the structure planned to be constructed in the time slider T of "November 1st" are displayed in the upper portion of the a function shown in FIG. 12. In the example of a b function shown in FIG. 12, an example of a case where the unillustrated related person U visually recognizes, from an arbitrary place, the conditions of the work execution of the structure planned to be constructed in the time slider T of "November 1st" is indicated. In other words, the unillustrated related person U operates, for example, a human-like icon P displayed in an image so as to be able to determine his/her own standing position in the virtual space. In this way, even when the structure planned to be constructed is large, and thus it is difficult to move it to a place desired to be checked by him/herself so as to actually check the structure, it is possible to easily check the structure planned to be constructed. Specifically, for example, as indicated in a c function shown in FIG. 12, a work experience around reinforcing iron bars and the checking of a work within a sheet spiral are mentioned.

In d to f functions shown in FIG. 13, various types of customized functions which can be utilized by the related person Ub are indicated. Specifically, when the d function show in FIG. 13 is seen, the related person Ub can finely adjust a display position on the 3D object while displaying the actual-size 3D object. As indicated in the e function shown in FIG. 13, it is possible to recognize contact between the actual-size 3D object and a real person by highlighting or sound. As indicated in the f function shown in FIG. 13, an actual-size construction machine or the like is arranged, and thus a construction work can be simulated.

In summary, the related person U utilizes various types of functions described above so as to be able to find in advance, for example, problems which are not noticed before the actual start of the work execution. Specifically, for example, the related person U visually recognizes the actual-size bridge such as before the start of the construction work and makes an examination in advance, and thereby can make obvious a problem in advance which can occur in an actual construction work, for example, a problem in which an arm is not passed through the mesh of reinforcing iron bars and thus the work cannot be performed. In other words, since the related person U utilizes various types of functions described above so as to more easily and intuitively understand the work execution steps, even if the related person U is not familiar with the construction work, it is easy to ask for a necessary correction in the construction step before the work execution. Hence, it is possible to expect, in the construction work, a cost reduction, the reduction of a construction period, the enhancement of safety, and the like, with the result that enhanced customer satisfaction is expected.

Figure 14:
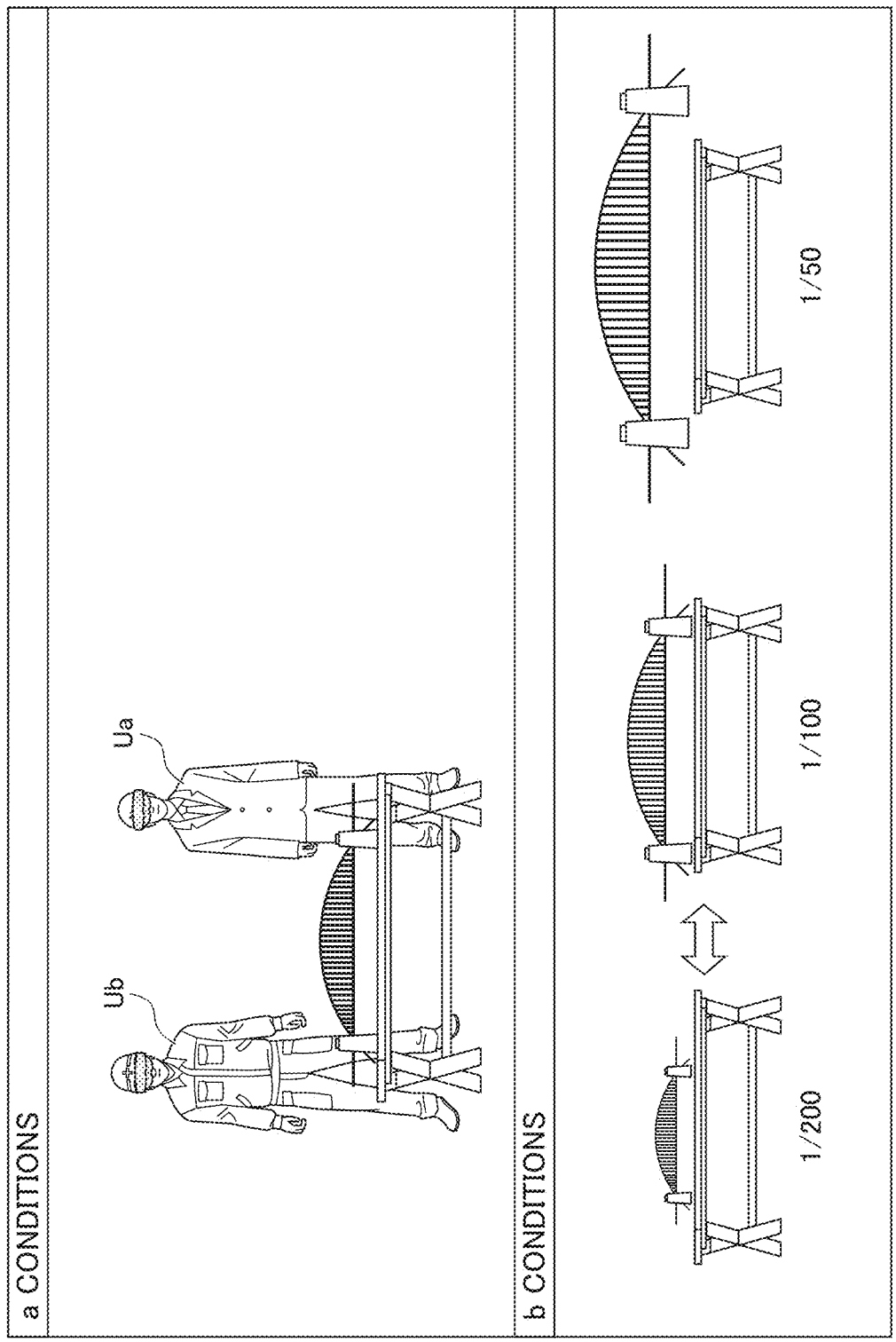
FIG. 14 is a diagram showing an example of a design change menu (1/2) among the functions which can be realized in the information processing system of FIG. 1.
Figure 15:
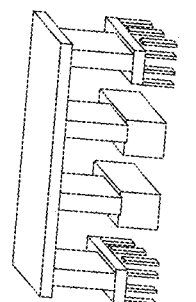
FIG. 15 is a diagram showing the example of the design change menu (2/2) among the functions which can be realized in the information processing system of FIG. 1.

FIG. 14 and FIG. 15 will be described. FIG. 14 and FIG. 15 are diagrams showing an example of the design change menu among the functions which can be realized in the information processing system of FIG. 1.

FIG. 14 and FIG. 15 are diagrams showing an example of the basic functions which can be realized in the information processing system according to the embodiment of the present invention, and are specifically diagrams showing an example of a case where the "design change menu" is adopted among the basic functions which can be realized in the information processing system according to the embodiment of the present invention. In a conditions shown in FIG. 14, conditions are indicated in which the related persons Ua and Ub have discussions while visually recognizing, in a virtual space, a 3D object planned to be constructed. Specifically, in the a conditions shown in FIG. 14, the related persons Ua and Ub can visually recognize the same 3D object from "standing positions" and "angles" which are individually desired by them. In other words, related persons U (such as a client, a consultant, and a contractor) in the construction project reference the same 3D object (and associated data), predict a problem which can occur in each step in the construction work, discus "whether the design needs to be changed" and "how the design should be changed" if needed, and thereby can examine whether or not each step in the construction work of the 3D object is appropriate. For example, when a plurality of patterns of steps in the construction work are assumed in advance, the results of the simulation of the cost, the schedule, the safety, and the like in the individual steps of the construction work can also be checked. Next, b conditions shown in FIG. 14 indicate an example of a case where the 3D object is enlarged or shrunk in the virtual space. In other words, the unillustrated related persons U can also visually recognize, as the 3D object planned to be constructed in the virtual space, the 3D object which is enlarged or shrunk with a magnification of, for example, $1/400$ times, $1/200$ times, $1/100$ times, $1/50$ times, $1/25$ times, 2 times, or the like. Specifically, for example, in the case of a large structure, a geological survey or the like is performed when a design is made, but after the start of the work execution, the facts may be found to differ from assumptions at the time of design. These functions can significantly contribute to, for example, a construction facilitation promotion meeting or the like in which in order to perform smooth communication, the related persons (such as the client, the consultant, and the contractor) in the construction project gather to exchange opinions.

An a function shown in FIG. 15 and a b function shown in FIG. 15 indicate an example of a case where the design is changed. When the a function shown in FIG. 15 is seen, it is possible to update the 3D object based on new drawing data. The design drawing of a changed part can be distinguished by highlighting or the like. The changed part in the drawing can be preferably checked based on the actual size. In other words, for example, when as in the case of FIG. 14 described above, as a result of an exchange of opinions between the related persons U (such as the client, the consultant, and the contractor) in the construction project, it is determined that the design needs to be changed, it is possible to visually recognize a new 3D object corresponding to the change of the design so as to check the new 3D object. Furthermore, when the b function shown in FIG. 15 is seen, in a case where the design change described above is performed, a cost before the design change and a cost after the design change and a construction period before the design change and a construction period after the design change are displayed. In other words, for example, the unillustrated related persons U can check the costs, the construction periods, and the like before and after the design change. The unillustrated related person U may also be allowed to check, in addition to the costs and the construction periods, for example, the schedule, the safety, and the like. In other words, the related persons U (such as the client, the consultant, and the contractor) in the construction project share the same data and use intuitive expressions on the 3D object (3D model), and thereby can expect smooth communication and the enhancement of productivity.

Figure 16:
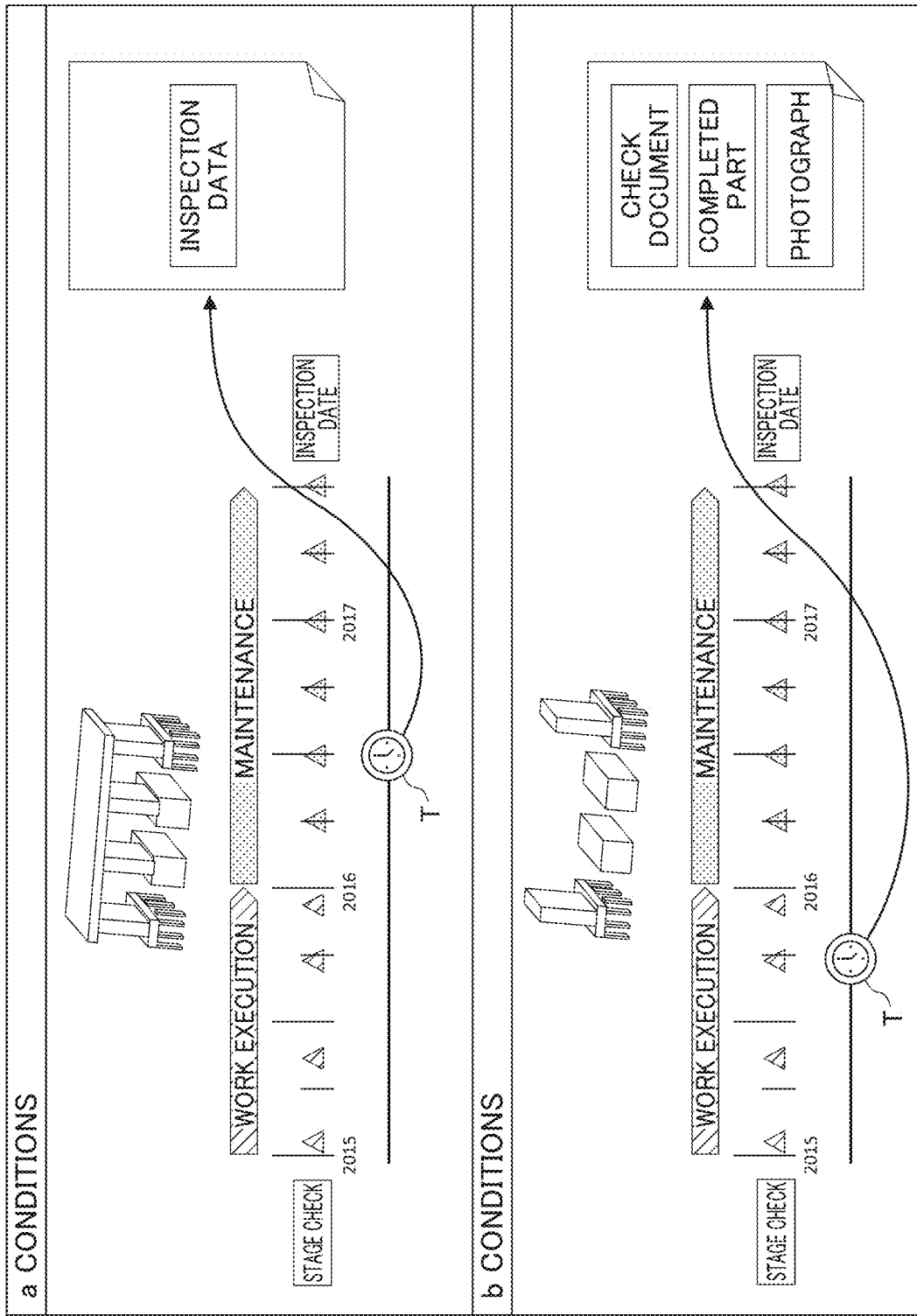
FIG. 16 is a diagram showing an example of a maintenance menu among the functions which can be realized in the information processing system of FIG. 1.

FIG. 16 is a diagram showing an example of the basic functions which can be realized in the information processing system of FIG. 1 and is specifically a diagram showing an example of a case where the "maintenance menu" is adopted among the basic functions which can be realized in the information processing system according to the embodiment of the present invention.

Here, a brief description will be given of a problem in maintenance in a conventional construction project. In the conventional maintenance, only a small amount of actual data at the time of work execution can be acquired by a maintenance person, and thus it is necessary to determine the details of the maintenance and the like based on limited data at the time of inspection. Furthermore, since the maintenance person needs to go to the site in order to determine the details of the maintenance and the like, the number of sites with which one specialist can deal is disadvantageously restricted. On this point, the maintenance person utilizes the information processing system described above so as to be able to acquire not only inspection data at the time of maintenance but also the actual data at the time of work execution, with the result that it is possible to make an accurate determination based on a large amount of information. Specifically, as indicated in a conditions shown in FIG. 16, the maintenance person selects, with the time slider T, the date on which an inspection is desired to be performed by him/herself so as to be able to reference the selected inspection data. In the example of the a conditions shown in FIG. 16, around June 2016 is selected as the date on which the inspection is desired to be performed. Here, examples of the inspection data which the maintenance person can reference include a checklist, a photograph, a drone video, and 3D scan data. In other words, in the example of the a conditions shown in FIG. 16, the maintenance person references a checklist and the like used in the maintenance performed around July 2016 so as to grasp what type of maintenance was performed in the maintenance, and thereby can make a determination about his/her own maintenance. When b conditions shown in FIG. 16 are seen, around September 2015 is selected as the date on which the inspection is desired to be performed. Here, as the data which the maintenance person can reference, for example, the stage check result document (data) composed of the check document, the completed part, the photograph, and the like is present. In other words, in the example of the b conditions shown in FIG. 16, the maintenance person references various types of data (such as the check document, the completed part, and the photograph) at the time of work execution around September 2015 so as to be able to make a determination about his/her own maintenance.

The "maintenance menu" as described above is adopted, and thus, for example, the maintenance person can realize accurate maintenance (maintenance management, diagnostic management), with the result that it is possible to expect the enhancement of quality as a whole. The maintenance person can remotely perform maintenance (maintenance management, diagnostic management) without providing scaffolding and the like for the actual object to be constructed or visiting the site, and thus one maintenance person can deal with a larger number of sites, with the result that it is possible to expect the enhancement of productivity.

Figure 17:
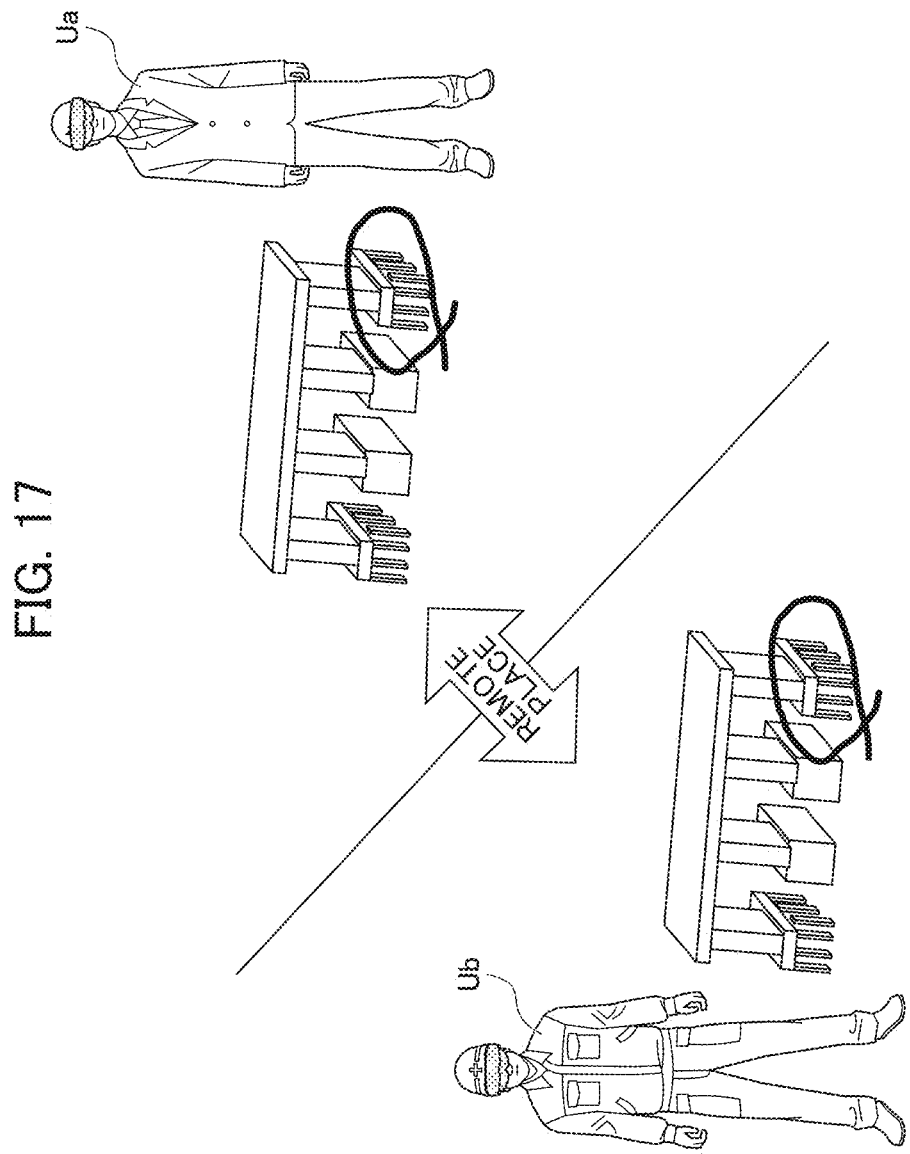
FIG. 17 is a diagram showing an example of a communication menu among the functions which can be realized in the information processing system of FIG. 1.

FIG. 17 is a diagram showing an example of the basic functions which can be realized in the information processing system of FIG. 1 and is specifically a diagram showing an example of a case where the "communication menu" is adopted among the basic functions which can be realized in the information processing system according to the embodiment of the present invention.

FIG. 17 shows an example where the related persons Ua and Ub are present in remote places. Specifically, the information processing system according to the embodiment of the present invention is utilized, and thus even when the related persons Ua and Ub are located in remote places, the related persons Ua and Ub visually recognize the same 3D object in their respective places so as to be able to share the imagery of the construction site. Specifically, the related person Ua (for example, a salesperson in a visiting place) and the related person Ub (for example, a site supervisor at the site) communicate with each other while visually recognizing, in their respective places, the 3D object planned to be constructed, and thereby can specifically share the imagery of a work and the process thereof in the actual construction site. Furthermore, a plurality of related persons as described above can have a conversation while seeing a design drawing and the like in remote places and indicating, by marking or the like, a specific part of the 3D object being visually recognized.

With respect to the details of the "communication menu" described with reference to FIG. 17 and the like, an outline of the function thereof, variations, and the like will be described below with reference to FIG. 18 to FIG. 25.

A brief description will first be given of the details of the "communication menu". The communication menu is utilized, for example, when the related persons Ua and Ub utilizing the HMDs 2 examine, while visually recognizing the 3D object and the like arranged within the virtual space, the work execution conditions of the work and a work execution policy. Specifically, for example, it is assumed that the related persons Ua and Ub are present in a range in which they cannot directly communicate with each other. In such a case, for example, the related persons Ua and Ub utilize their respective HMDs 2 so as to be able to visually recognize the 3D object. However, for example, when the related persons Ua and Ub discuss the conditions of one region of a target, if they do not accurately grasp which part of the 3D object their partner wants to discuss, it is difficult to have discussions. Hence, the communication menu in the present embodiment adopts an avatar arrangement function as a function for related persons to perform smooth communication. The avatar arrangement function is one of the most important functions among functions associated with the communication menu. In the avatar arrangement function, for example, in the HMD 2 worn by the related person Ua, a human-like object (hereinafter referred to as an "avatar") corresponding to the position and the angle of another related person (for example, the related person Ub) within the virtual space is arranged within the virtual space. In other words, with the avatar function, the related person Ua can visually grasp the position and the angle of the related person Ub within the virtual space so as to be able to communicate with the related person Ub more smoothly. A specific method and processing for arranging, with the HMD 2, the avatar within the virtual space will be described later with reference to FIG. 18 and the like. A series of processing steps in which the HMD 2 arranges the avatar within the virtual space so as to make the display unit 36 display it are collectively referred to as the avatar arrangement processing, and the avatar arrangement processing will also be described later with reference to FIG. 18 and the like.

Figure 18:
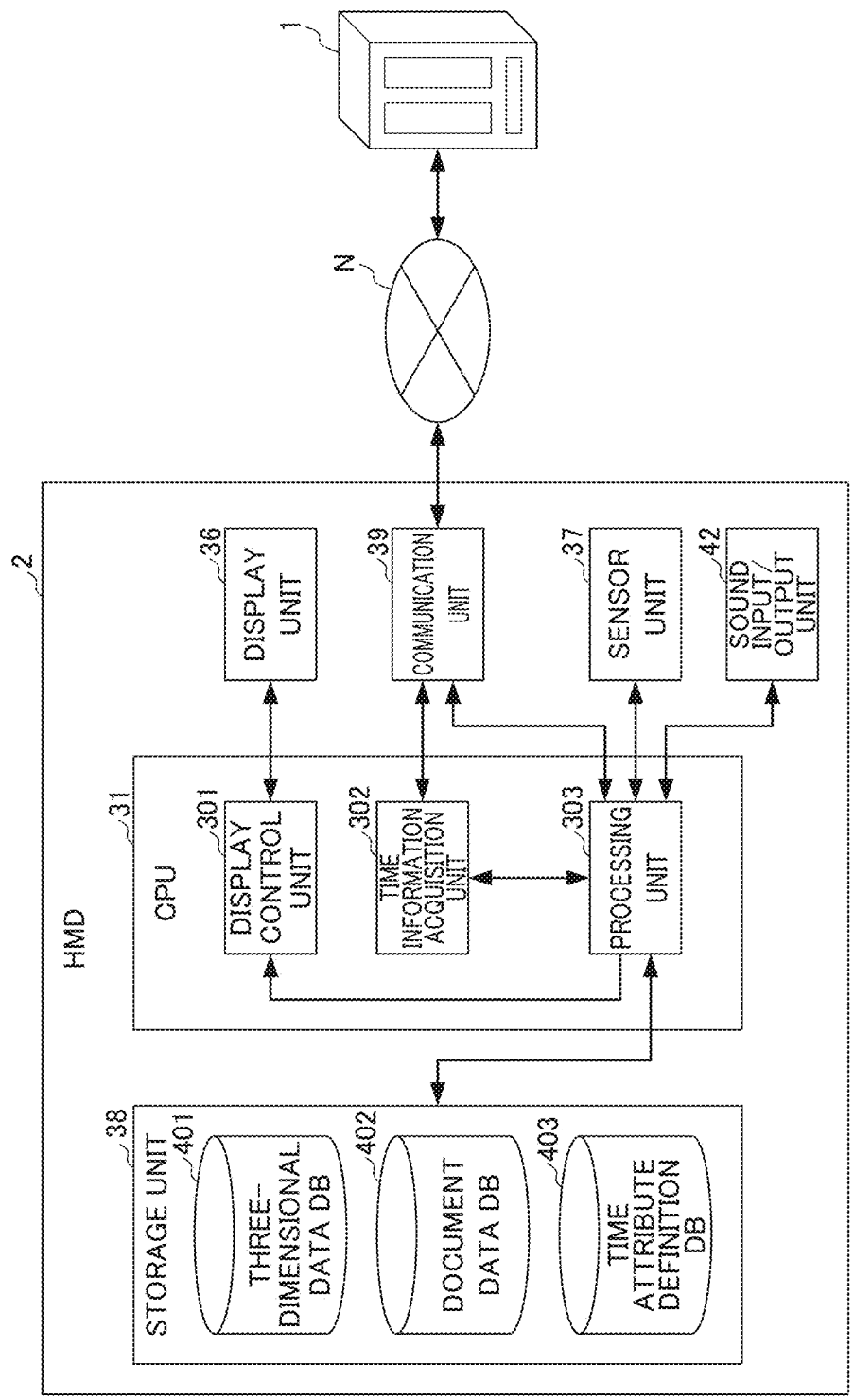
FIG. 18 shows functional blocks indicating an example of a functional configuration for realizing the "communication menu" illustrated in FIG. 17 and the like among the functional configurations of the HMD of FIG. 6.

FIG. 18 shows functional blocks indicating an example of the functional configuration of the functions related to the "communication menu" described with reference to FIG. 17 and the like among the functional configurations of the HMD in FIG. 6.

Here, the hardware configuration of the HMD in FIG. 18 is obtained by adding a sound input/output unit 42 to the hardware configuration of FIG. 6 described previously. Although not illustrated, the sound input/output unit 42 is connected to the input/output interface 35 of FIG. 6.

Specifically, for example, the sound input/output unit 42 is formed with a microphone and a headphone (headset). The microphone receives an input of external sound, converts it into electrical signals (in the following description, such signals are referred to as "sound information") and supplies them to the processing unit 303 of the CPU 31. The headphone converts the sound information supplied from the processing unit 303 of the CPU 31 into sound with a sound-emitting member (such as speakers) close to the ears (tympanic membranes) of the related persons Ua and Ub and the like.

As shown in FIG. 18, in the CPU 31 of the HMD 2, a display control unit 301, a time information acquisition unit 302, and the processing unit 303 function. In the storage unit 38, a three-dimensional data DB 401, a document data DB 402, and a time attribute definition DB 403 are provided.

The processing unit 303 performs, through the display control unit 301, various types of processing on the image displayed in the display unit 36 and various types of processing on the sound input and output to the sound input/output unit 42.

The various types of processing on the sound will first be described using, as an example, a "conversation" with reference to the above-described FIG. 17. In order to establish a conversation between the related persons Ua and Ub who are present in remote places, each of the related persons Ua and Ub needs to be wearing the HMD 2 having the functional configuration shown in FIG. 18. Here, for ease of description, the configuration and the processing on the side of the HMD 2 worn by the related person Ua will be described. The same configuration and processing as will be described below are naturally realized in the HMD 2 worn by the related person Ub.

The sound emitted by the related person Ua is input to the sound input/output unit 42, converted into sound information, and supplied to the processing unit 303. The processing unit 303 performs control processing so as to make the server 1 transmit the sound information from the communication unit 39 through the network N. The sound information is transmitted from the server 1 through the network N to the HMD 2 worn by the related person Ub. In this way, the related person Ub can hear sound corresponding to the sound information output from the HMD 2, that is, the sound emitted by the related person Ua.

On the other hand, the sound emitted by the related person Ub is input to the HMD 2 worn by the related person Ub, converted into sound information, output, and transmitted to the server 1 through the network N. The sound information is further transmitted from the server 1 through the network N to the HMD 2 worn by the related person Ua. The processing unit 303 receives the sound information in the communication unit 39, performs various types of processing, and supplies it to the sound input/output unit 42. In this way, the related person Ua can hear sound corresponding to the sound information output from the sound input/output unit 42, that is, the sound emitted by the related person Ub.

Here, the processing which is performed on the sound information with the processing unit 303 is not particularly limited, and various types of processing can be adopted. For example, the following processing is performed with the processing unit 303. Specifically, when processing (the details of which will be described later) on the image is performed with the processing unit 303, the avatar of the conversation partner (for example, the related person Ub for the related person Ua) is visually recognized by the person wearing the HMD 2 (for example, the related person Ua) such that the avatar is arranged in the position of presence (position corresponding to a predetermined place in the actual space) within the virtual space. In other words, the image which is visually recognized as described above is displayed in the display unit 36. In this case, the processing unit 303 performs, on the sound information, the processing in which on the assumption that a sound-producing source is the position of presence of the avatar within the virtual space, balance in the sound output is adjusted based on a positional relationship between the sound-producing source and a sound transmission destination (person wearing the HMD 2, for example, the related person Ua). In this way, for example, when the avatar is present on the right side of the sound transmission destination (person wearing the HMD 2, for example, the related person Ua) within the virtual space, the sound emitted by the avatar (in actuality, for example, the sound emitted by the conversation partner such as the related person Ub in a remote place) is output from a speaker on the right side of the sound input/output unit 42, with the result that it is possible to hear the sound from the right ear of the sound transmission destination.

In the processing performed with the processing unit 303, an example of the processing on sound is described above. In the processing performed with the processing unit 303, an example of the processing on an image will be described next. The processing on the image is processing corresponding to the display image generation processing which is described previously with reference to FIG. 7. Although in the description, the display image generation processing is performed on the side of the server 1, all of the display image generation processing does not necessarily need to be performed on the side of the server 1. Hence, here, on the assumption that the display image generation processing is performed on the side of the HMD 2, a description will be given below. In other words, as the processing on the display image, for example, the following processing based on the display image generation processing described above is performed with the processing unit 303.

Hence, here, it is assumed that, in the example of FIG. 7, databases corresponding to the various types of DBs provided in the storage unit 18 of the server 1 are provided in the storage unit 38 of the HMD 2. Specifically, the three-dimensional data DB 401 corresponds to the object DB 500 in FIG. 7. Here, as described with reference to FIG. 9 and FIG. 10, the 3D object is divided into individual layers, and they are associated with the time information (predetermined periods). The document data DB 402 stores the stage check result document, the inspection documents displayed in the multiwindow, and various types of other documents (hereinafter collectively referred to as "document data"). The time attribute definition DB 403 stores the individual layers of the 3D object and the information of time attribute definitions including the association with the time information and the like. In other words, in the storage unit 38, the 3D object (3D model) is stored in the three-dimensional data DB 401, the document data (two-dimensional) is stored in the document data DB 402 and the information of the time attribute definitions (four-dimensional) is stored in the time attribute definition DB 403. Here, in the 3D object (3D model), the minimum model units are set as the layers. In the document data, file units are set as the layers. In each of the layers, the time axis (period) indicated with a start time and a completion time is defined as the time attribute. The details of the definitions of the individual layers are set to the information of time attribute definitions.

The processing unit 303 searches the three-dimensional data DB 401 and the time attribute definition DB 403 so as to acquire the information of the individual layers associated with an arbitrary time axis (period) or a time (for example, Jun. 15, 2015 at 10:10 a.m.) indicated by the time information acquisition unit 302 which will be described later. The processing unit 303 stacks the individual layers so as to generate the 3D object. The processing unit 303 establishes the virtual space and arranges the 3D object described above. In addition to the 3D object, the processing unit 303 arranges various types of information such as the time slider T described above within the virtual space.

Furthermore, here, the processing unit 303 arranges the avatar of the conversation partner (for example, the related person Ub for the related person Ua) in the position of presence (position corresponding to a predetermined place in the actual space) within the virtual space. Specifically, for example, the processing unit 303 performs the following processing in order to arrange the avatar in the virtual space in a remote environment. Specifically, in the HMD 2 of the conversation partner such as the related person Ub, information indicating the position of presence and information for identifying the viewpoint in the position of presence, that is, the information of a position from a reference point, a height from the reference point, the inclination of the neck, a sight line, and the like are acquired as avatar information and are transmitted to the server 1. Here, the reference point is a reference point in the virtual space serving as a reference for grasping the arrangement positions and the information of the avatar and the 3D object in the virtual space of the HMD 2 worn by the related person U. Since the avatar information is transmitted from the server 1, the processing unit 303 receives it through the communication unit 39. The processing unit 303 arranges, based on the avatar information, the avatar of the conversation partner such as the related person Ub within the virtual space. Here, since the virtual space is also established in the HMD 2 of the conversation partner such as the related person Ub, it is necessary to arrange the avatar of the person wearing the HMD 2 (such as the related person Ua) within the virtual space. Hence, the processing unit 303 generates, based on information from the sensor unit 37 and the like, the avatar information of the person wearing the HMD 2 (such as the related person Ua), and transmits it to the server 1 through the communication unit 39.

As described above, the processing unit 303 can perform various types of processing including the avatar arrangement processing for arranging the avatar in the virtual space on the communication menu, and thus the related persons (for example, the related persons Ua and Ub) utilizing the HMDs 2 can perform more smooth communication.

The time information acquisition unit 302 acquires, through the communication unit 39, information (hereinafter referred to as "specified time information") on an arbitrary time axis (time) or a time. Here, the specified time information may be acquired, for example, by an operation by the unillustrated controller 3 or from the server 1 or a different HMD 2. Furthermore, for example, types of specified time information acquired by the related persons Ua and Ub may be the same as each other or may not necessarily be the same as each other. When the related persons Ua and Ub are made to receive the same specified time information, for example, a configuration may be adopted in which a master user (for example, the related person Ua) and a subordinate user (for example, the related person Ub) are determined in advance, and in which the specified time information acquired in the HMD 2 of the master user is acquired in the HMD 2 of the subordinate user.

The display control unit 301 performs control so as to display, in the display unit 36, three-dimensional data (for example, the object), two-dimensional data (for example, the document data), the avatar, and the like. The display control unit 301 may not only perform control so as to simply display the avatar to be displayed in the display unit 36 but also perform control so as to produce displays as follows. Specifically, for example, the display control unit 301 may perform control so as to display the avatar in a flashing manner corresponding to the related person who issues sound. The display control unit 301 may also perform control so as to display the name of each of the related persons above the head of the avatar corresponding to the related person. For example, the display control unit 301 may also perform control so as to move, in accordance with the movement of the neck of each of the related persons, the neck of the avatar.

FIG. 19 is a diagram showing the transmission and reception of various types of information and conditions of arrangement of the avatar for realizing the "communication menu" in FIG. 18. Here, "local" refers to a case where a receiver and a sender are present in such a range that they can directly communicate with each other. A specific example is a case where the receiver and the sender utilize the HMDs 2 in the same meeting room to have a meeting. "Remote" refers to a case where the receiver and the sender are not present in such a range that they can directly communicate with each other. A specific example is a case where the receiver and the sender utilize the HMDs 2 in remote places (for example, Tokyo and Osaka) to have a meeting. The sender refers to a person who transmits the avatar information and the like acquired in the sensor unit 37 and the like, and the receiver refers to a person who acquires the avatar information and the like received from the sender.

A specific description will be given below. As shown in FIG. 19, for example, in the uppermost section, "user relationship sender-receiver", "position", "height", "sound", "operation", and "avatar display" are displayed from the left. The "user relationship sender-receiver" in the uppermost section refers to a relationship between the sender and the receiver. Specifically, for example, the left side indicates the sender, the right side indicates the receiver, and "local-local" refers to a case where both the sender and the receiver are in a local environment. The "position" in the uppermost section refers to information on a position from the reference point which is acquired in the sensor unit 37 of the HMD 2 worn by the sender side. The "height" in the uppermost section refers to information on a height from the reference point which is acquired by the sensor unit 37 of the HMD 2 worn by the sender side. The "sound" in the uppermost section refers to sound information acquired in the sound input/output unit 42 of the HMD 2 worn by the sender side. The "operation" in the uppermost section refers to information (hereinafter referred to as "operation information") on the operation of the time information for arranging the 3D object by use of the time slider function with the controller 3 or the like on the sender side. The "avatar display" in the uppermost section refers to the display of the avatar of the sender side to the receiver, that is, the arrangement of the avatar. Here, in the case of the "position", the "height", and the "operation", "o" means that the sender transmits the information described above whereas in the case of the "sound" and the "avatar display", "o" means that the sound is output and the avatar is arranged. In the case of the "position", the "height", and the "operation", "x" means that the sender does not transmit the information described above whereas in the case of the "sound" and the "avatar display", "x" means that the sound is not output and the avatar is not arranged.

(1) In the case of "local-local":
When both one sender and one or more receivers are in the local environment, the sections of the "position", the "height", and the "operation" indicate "o", and thus the sender transmits the information on the position and the height from the reference point and the operation information. On the other hand, the sections of the "sound" and the "avatar display" indicate "x", and thus for the receiver, the sound information is not output and the avatar is not arranged. This is because, since both the sender and the receiver are in the local environment, the sender transmits the information on the position and the height from the reference point but does not need to arrange the avatar. With respect to the sound information, since both the sender and the receiver are in the local environment, the sound information is transmitted to the receiver but does not need to be output. In this way, in the case of (1), in the HMD 2 worn by the receiver, the 3D object is arranged, but the avatar of the sender is not arranged.

(2) In the case of "remote-local":
When one sender is in the remote environment and one or more receivers are in the local environment, the "position", the "height", the "sound", the "operation", and the "avatar display" indicate "o". Specifically, for the receiver, the sender transmits the information on the position and the height from the reference point, the sound information, and the operation information and arranges the avatar. In this way, in the case of (2), in the HMD 2 worn by the receiver, the 3D object is arranged, the sound of the sender is output, and the avatar is arranged.

(3) In the case of "local-remote":
When one sender is in the local environment and one or more receivers are in the remote environment, the "position", the "height", the "sound", the "operation", and the "avatar display" indicate "o". Specifically, as in the case of (2) described above, for the receiver, the sender transmits the various types of information described above and arranges the avatar. In this way, in the case of (3), as in the case of (2), in the HMD 2 worn by the receiver, the 3D object is arranged, the sound of the sender is output, and the avatar is arranged.

Figure 20:
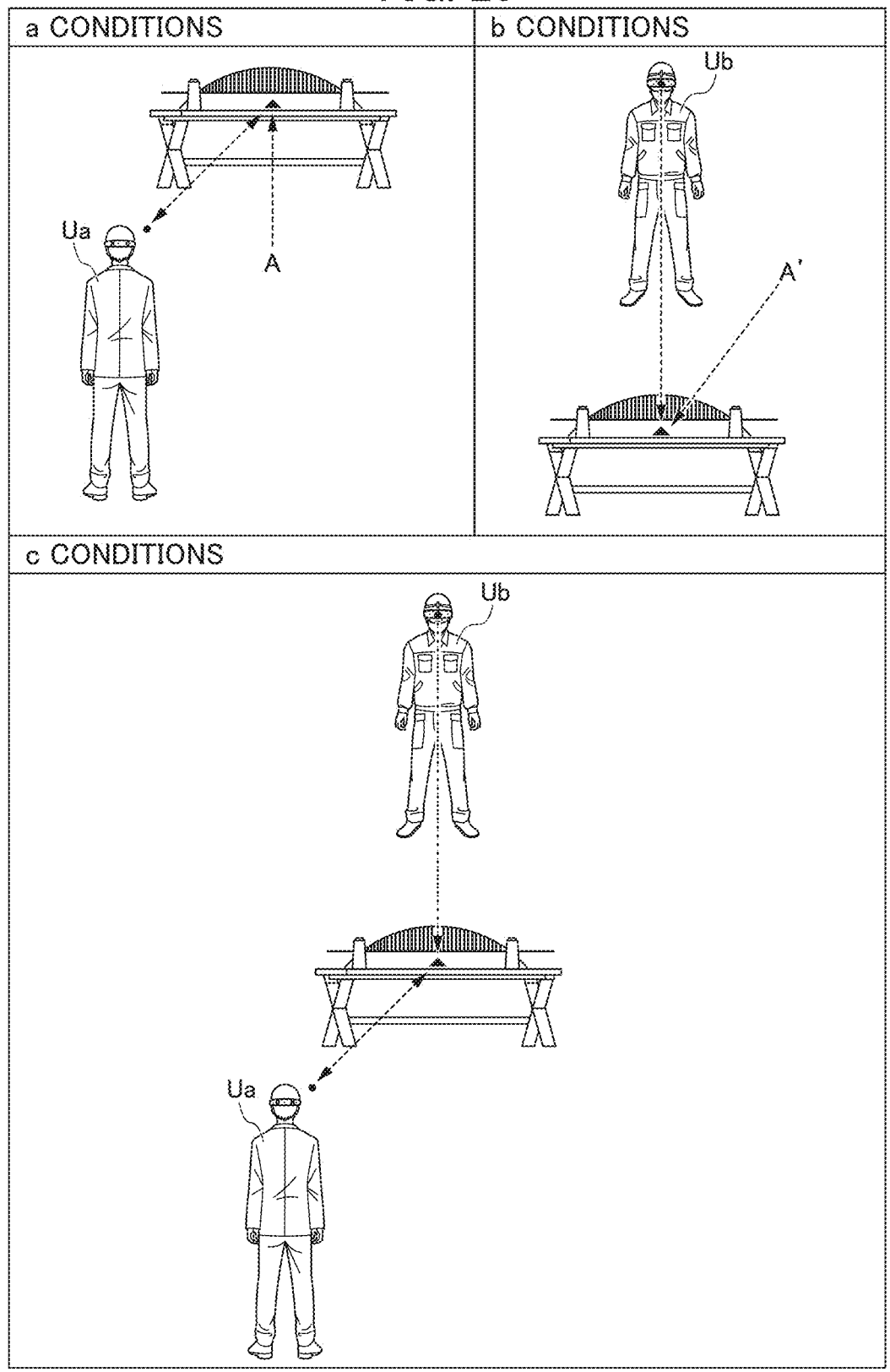
FIG. 20 is a diagram showing the arrangement of a 3D object in the same space by an existing technology.

FIG. 20 is a diagram showing the arrangement of the 3D object in the same space by an existing technology. Here, for ease of description, a description will be given on the assumption that the HMD 2 worn by the related person Ua is the HMD 2-*a* and the HMD 2 worn by the related person Ub is the HMD 2-*b*.

In a conditions shown in FIG. 20, here, for example, the related person Ua is present in a predetermined space (the local environment or the remote environment) such as an office in a Tokyo headquarters. In the a conditions shown in FIG. 20, in the predetermined space described above, the related person Ua can visually recognize the 3D object in the virtual space displayed in the display unit 36 of the HMD 2-*a* worn by the related person Ua. Here, a reference point A in the a conditions shown in FIG. 20 is a reference point in the virtual space serving as a reference for grasping the arrangement positions and information of the avatar and the 3D object in the virtual space of the HMD 2-*a* worn by the related person Ua. Since the related person Ua sets the reference point A such that the reference point A is fixed in the virtual space, in the a conditions shown in FIG. 20, the 3D object can be arranged about the reference point A by the existing technology. Here, a method of setting the reference point A is not particularly limited, and specifically, for example, here, the related person Ua may use an unillustrated controller 3 or the like so as to set, to the reference point, an arbitrary position in which the 3D object is desired to be arranged in the virtual space. In this way, when the related person Ua visually recognizes the 3D object, the related person Ua can set an arbitrary position to the reference point regardless of whether a room is narrow or broad, and thus the related person Ua can arrange the 3D object and the like in a position which the related person Ua easily sees. In b conditions shown in FIG. 20, here, for example, the related person Ub is present in a predetermined space (hereinafter referred to as a "remote place"), such as an office in an Osaka branch, which is different from the related person Ua. In the b conditions shown in FIG. 20, for example, in the remote place described above, the related person Ub can visually recognize the 3D object in the virtual space displayed in the display unit 36 of the HMD 2-b worn by the related person Ub. Here, in the b conditions shown in FIG. 20, as with the reference point A, a reference point A' is a reference point in the virtual space serving as a reference for grasping the arrangement positions and information of the avatar and the 3D object in the virtual space of the HMD 2-b worn by the related person Ub. Since the related person Ub sets the reference point A' such that the reference point A' is fixed in the virtual space, in the b conditions shown in FIG. 20, the 3D object can be arranged about the reference point A' by the existing technology. With respect to a method of setting the reference point A', the reference point A' can be set by the related person Ub in the same method as the method of setting the reference point A. In this way, when the related person Ub visually recognizes the 3D object, the related person Ub can set an arbitrary position to the reference point regardless of whether a room is narrow or broad, and thus the related person Ub can arrange the 3D object and the like in a position which the related person Ub easily sees. In c conditions shown in FIG. 20, here, for example, the related persons Ua and Ub are present in the same predetermined space. In the c conditions shown in FIG. 20, the related persons Ua and Ub can visually recognize the 3D object in the virtual spaces displayed in the display units 36 of the HMDs 2-a and 2-b worn by them. Here, for example, in the HMD 2-a worn by the related person Ua or the HMD 2-b worn by the related person Ub, the reference point A set by the related person Ua and the reference point A' set by the related person Ub can be set to the same position. In this way, in the existing technology, the reference point A set by the related person Ua and the reference point A' set by the related person Ub can be set to the same position, and thus a direction and a distance from the reference point A are recognized by a device with the existing technology, with the result that the 3D object and the like can be arranged in the same virtual space. In this way, in the c conditions shown in FIG. 20, the same 3D object is arranged in the virtual spaces of the HMDs 2-a and 2-b worn by the related persons Ua and Ub, and thus the related person Ua can visually recognize the 3D object from the front surface and the related person Ub can visually recognize the 3D object from the back surface. The related persons Ua and Ub share the same virtual space so as to arrange the same 3D object, and thereby can communicate with each other.

Figure 21:
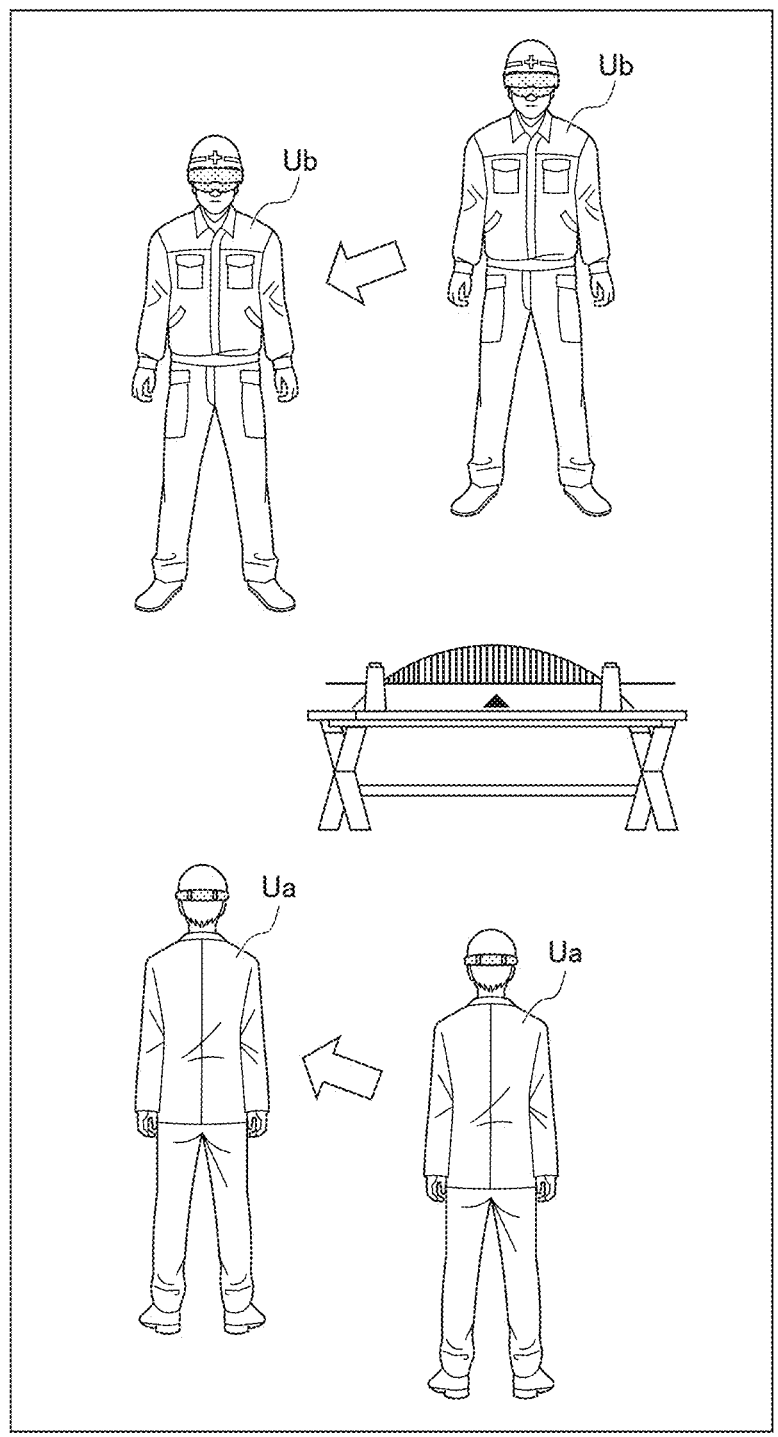
FIG. 21 is a diagram on the movement of related persons in the same space by the existing technology.

FIG. 21 will be described. FIG. 21 is a diagram on the movement of the related persons in the same space by the existing technology.

In the existing technology, when as shown in FIG. 21, a plurality of related persons U (for example, the related persons Ua and Ub) are present in the same space, the related persons Ua and Ub can visually recognize the same 3D object in the same virtual space described above while they are moving. Even when the related persons Ua and Ub individually move, the reference point A set as described above is fixed, and thus the 3D object is arranged based on the fixed reference point A. Hence, the related persons Ua and Ub move by themselves so as to be able to visually recognize the same 3D object and the like in the same virtual space in various positions at various angles.

Figure 22:
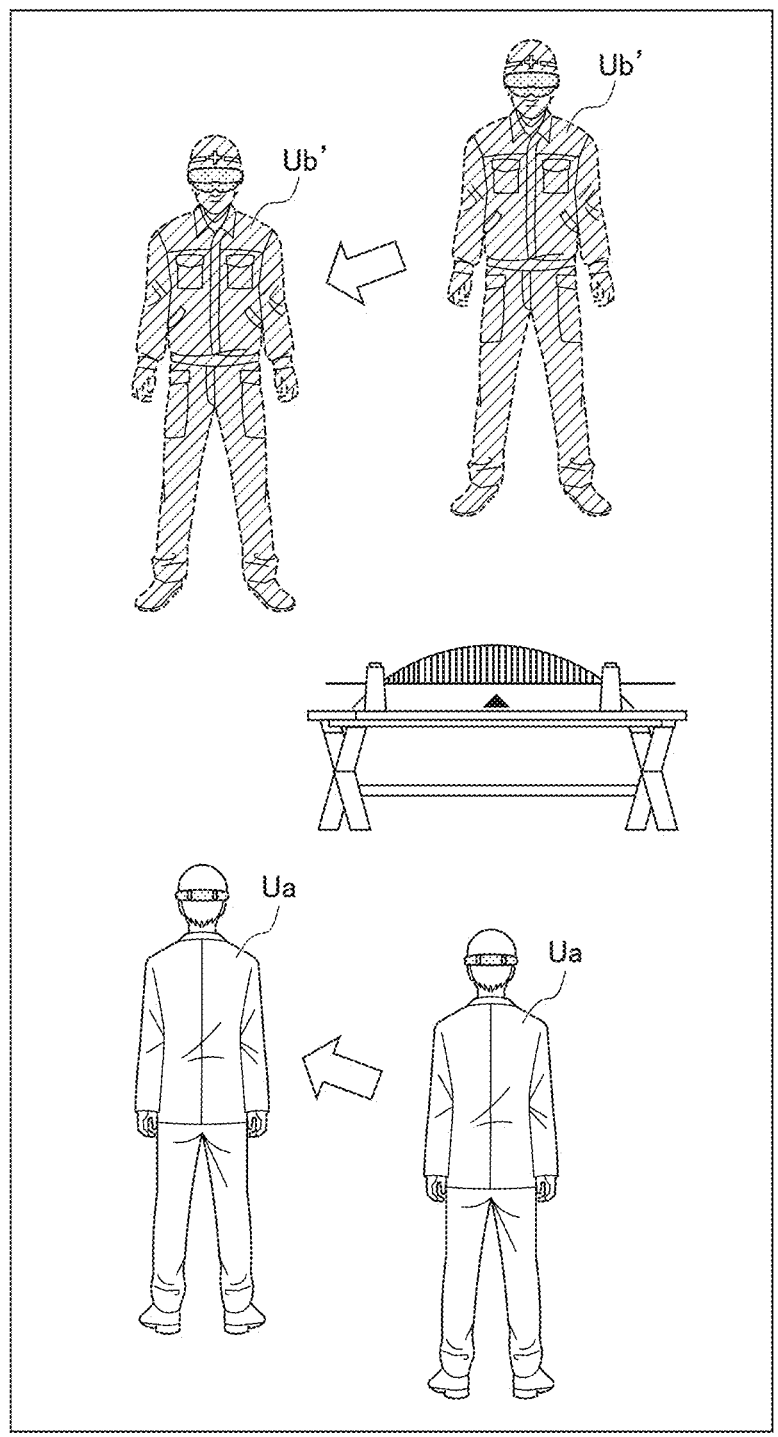
FIG. 22 is a diagram on the movement of the related persons in separate spaces by use of remote communication.

FIG. 22 is a diagram on the movement of the related persons in separate spaces by use of remote communication. The remote communication is that when a plurality of related persons U are separated at a distance from each other, they individually arrange the 3D object, the avatar, and the like within the same virtual space with the HMDs 2 through the server 1 so as to have a conversation, a meeting, or the like. For example, a construction project involves a large number of related persons U. Hence, it is very important for a large number of related persons U to share the recognition of work steps and the like. Thus, the related persons U use the remote communication described above so as to have a detailed meeting for each of the steps and check the safety of the site while simultaneously referencing and operating the same 3D object and the like in the virtual space. For example, the related person Ua can have a conversation, a meeting, or the like with the related person Ub who is present in a remote place while the same 3D object and the like are being arranged through the network N and the positions, the sight lines, and the like thereof are being recognized. The related person Ua arranges the related person Ub present in the remote place as an avatar Ub' in the virtual space so as to be able to perform more realistic communication.

As shown in FIG. 22, here, for example, it is assumed that the related person Ua is present in an office in a Tokyo headquarters or the like and that the related person Ub is present in a remote place such as an office in an Osaka branch. Hence, the related person Ua visually recognizes, in the virtual space of the HMD 2-a worn by the related person Ua, the 3D object and the related person Ub present in the remote place as the avatar Ub'. In the example of FIG. 22, the 3D object and the avatar Ub' of the related person Ub visually recognized by the related person Ua will be described. Specifically, for example, the related person Ua can visually recognize, while moving by him/herself, the 3D object and the avatar Ub' of the related person Ub displayed in the virtual space. The HMD 2-b worn by the related person Ub acquires, through the sensor unit 37, the avatar information (such as a position and an angle from the reference point A) of the related person Ub corresponding to the movement of the related person Ub. Then, the acquired avatar information of the related person Ub is transmitted to the HMD 2-a worn by the related person Ua. The HMD 2-a worn by the related person Ua acquires the avatar information of the related person Ub, arranges (rearranges), based on the information, the avatar Ub' corresponding to the related person Ub, and displays it in the display unit 36. In other words, in this way, the related persons Ua and Ub can visually recognize, in the HMDs 2-a and 2-b worn by themselves, avatars Ua' and Ub' reflecting a positional relationship from the 3D object and the like, and thus even when the related persons Ua and Ub are present in such separate spaces that they cannot directly communicate with each other, they can achieve, through the network N, within the same virtual space, expressions which correspond to each other. The same is true for FIG. 23.

Figure 23:
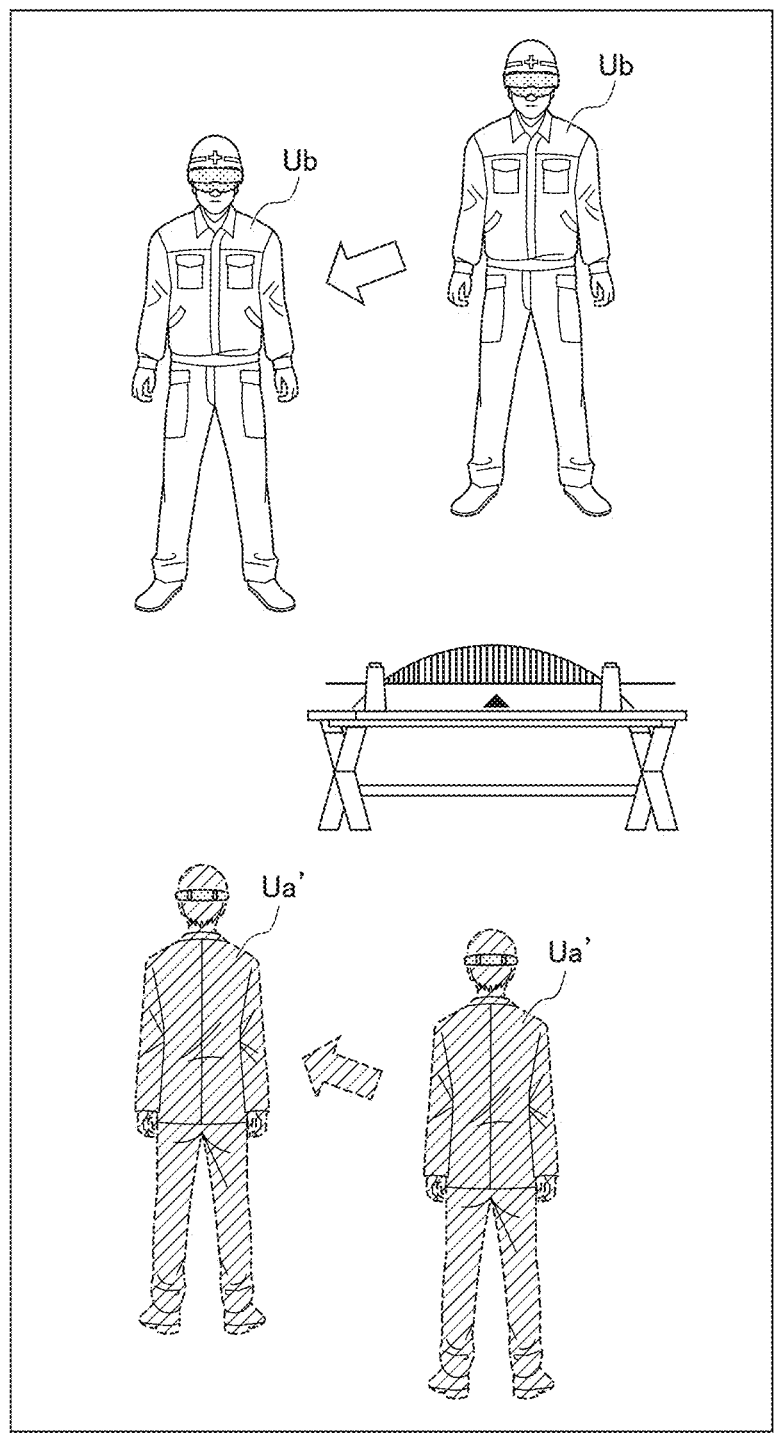
FIG. 23 is a diagram on the movement of the related persons in the separate spaces by use of the remote communication and is a diagram showing an example different from FIG. 22.

FIG. 23 is a diagram on the movement of the related persons in separate spaces by use of the remote communication and is a diagram showing an example different from FIG. 22.

As shown in FIG. 23, it is assumed, as in the example of FIG. 22, that the related person Ua is present in an office in a Tokyo headquarters or the like and that the related person Ub is present in a remote place such as an office in an Osaka branch. Hence, the related person Ub visually recognizes, in the virtual space of the HMD 2-b worn by the related person Ub, the 3D object and the related person Ua present in the office in the Tokyo headquarters or the like as the avatar Ua'.

In the example of FIG. 23, unlike the example of FIG. 22, the 3D object and the avatar Ua' of the related person Ua visually recognized by the related person Ub will be described. Specifically, for example, as in FIG. 22, the related person Ub can visually recognize, while moving by him/herself, the 3D object and the avatar Ua' of the related person Ua displayed in the virtual space. The HMD 2-a worn by the related person Ua acquires, through the sensor unit 37, the avatar information of the related person Ua corresponding to the movement of the related person Ua. Then, the acquired avatar information is transmitted to the HMD 2-b worn by the related person Ub. The HMD 2-b worn by the related person Ub acquires the avatar information of the related person Ua, arranges (rearranges), based on the information, the avatar Ua' corresponding to the related person Ua, and can display it in the display unit 36.

FIG. 24 is a diagram on the arrangement of the avatar by use of the remote communication of FIG. 22 and FIG. 23. Here, with respect to the sound sender recognition of the avatar, for ease of description, a description will be given on the assumption that the related persons U are three persons who are related persons Ua, Ub, and Uc. The description will also be given on the assumption that the HMD 2 worn by the related person Ua is the HMD 2-a, the HMD 2 worn by the related person Ub is the HMD 2-b, and the HMD 2 worn by the related person Uc is an HMD 2-c.

It is assumed that the server 1 which is not shown in FIG. 24 communicates with the HMDs 2-a, 2-b, and 2-c so as to receive various types of information. In other words, each of the HMDs 2-a, 2-b, and 2-c constantly transmits and receives, through the server 1, information indicating the persons' own positions, avatar information, and information such as sound information which needs to be exchanged with each other (hereinafter referred to as "exchange information"). Hence, the individual HMDs 2-a, 2-b, and 2-c perform the following processing based on the exchange information.

In a conditions shown in FIG. 24, for example, it is assumed that the related persons Ua, Ub, and Uc are present in the same space such as an office in a Tokyo headquarters. In this case, each of the related persons Ua, Ub, and Uc can visually recognize the presence of the actual persons. The HMDs 2-a to 2-c worn by the related persons Ua to Uc can also be set such that they do not output sound and that no avatar is arranged in the virtual space. Whether or not the avatar is arranged in the virtual space and the sound is output will be described.

Although the description is omitted in FIG. 18, for example, the HMDs 2-a to 2-c worn by the related persons Ua to Uc can have the function of notifying the information of their own current positions (for example, the office in the Tokyo headquarters) obtained by utilization of GPS (Global Positioning System) or the like. Hence, for example, the HMD 2-a worn by the related person Ua transmits, in addition to the information on the current position described above, as the exchange information, the avatar information, the sound information, and the like to the HMDs 2-b and 2-c through the server 1. Likewise, the HMD 2-b transmits the exchange information to the HMDs 2-a and 2-c through the server 1. The HMD 2-c transmits the exchange information to the HMDs 2-a and 2-b through the server 1. In this way, the server 1 can acquire the exchange information of the HMDs 2-a to 2-c so as to determine, based on the information on the present positions of the HMDs 2-a to 2-c, that the related persons Ua to Uc are present within a constant range. In other words, the server 1 determines, for example, the case of (1) "local-local" shown in FIG. 19. Hence, although the HMD 2-a worn by the related person Ua receives the exchange information (such as the sound information and the avatar information) from the HMDs 2-b and 2-c, the HMD 2-a does not output the sound of the related persons Ub and Uc and does not arrange the avatar Ub' of the related person Ub and the avatar Uc' of the related person Uc. In this way, in the virtual space displayed in the display unit 36 of the HMD 2-a worn by the related person Ua, the 3D object and the like are arranged, but the avatar Ub' of the related person Ub and the avatar Uc' of the related person Uc are not arranged, and the sound of the related persons Ub and Uc is not output from the sound input/output unit 42. Likewise, although the HMD 2-b worn by the related person Ub receives the exchange information (such as the sound information and the avatar information) from the HMDs 2-a and 2-c, the HMD 2-b does not output the sound of the related persons Ua and Uc and does not arrange the avatar Ua' of the related person Ua and the avatar Uc' of the related person Uc. In this way, in the virtual space displayed in the display unit 36 of the HMD 2-b worn by the related person Ub, the 3D object and the like are arranged, but the avatar Ua' of the related person Ua and the avatar Uc' of the related person Uc are not arranged, and the sound of the related persons Ua and Uc is not output from the sound input/output unit 42. Likewise, although the HMD 2-c worn by the related person Uc receives the exchange information (such as the sound information and the avatar information) from the HMDs 2-a and 2-b , the HMD 2-c does not output the sound of the related persons Ua and Ub and does not arrange the avatar Ua' of the related person Ua and the avatar Ub' of the related person Ub. In this way, in the virtual space displayed in the display unit 36 of the HMD 2-c worn by the related person Uc, the 3D object and the like are arranged, but the avatar Ua' of the related person Ua and the avatar Ub' of the related person Ub are not arranged, and the sound of the related persons Ua and Ub is not output from the sound input/output unit 42. The information of the present positions described above is not limited to the GPS function, and for example, the present positions may be acquired and transmitted by a function of a beacon or the like.

In the upper diagram of b conditions shown in FIG. 24, for example, it is assumed that the related persons Ua and Uc are present in the same space such as the office in the Tokyo headquarters and that the related person Ub is present in a separate space in an office in an Osaka branch. In this case, the related persons Ua and Uc can recognize the presence of the actual related persons Ua and Uc. However, the related persons Ua and Uc cannot recognize the presence of the actual related person Ub. Hence, the HMDs 2-a and 2-c worn by the related persons Ua and Uc can output the sound of the related person Ub and arrange the avatar Ub' of the related person Ub in the virtual space. The HMDs 2-a and 2-c worn by the related persons Ua and Uc can be set such that they do not output the sound of the related persons Ua and Uc and do not arrange the avatar Ua' of the related person Ua and the avatar Uc' of the related person Uc in the virtual space. Here, whether or not the avatar is arranged in the virtual space and the sound is output will be described. For example, the HMDs 2-a and 2-c worn by the related persons Ua and Uc transmit, in addition to the information of the current positions, as the exchange information, the avatar information, the sound information, and the like to the HMD 2-b through the server 1. Likewise, the HMD 2-b transmits the exchange information to the HMDs 2-a and 2-c through the server 1. The exchange information is also transmitted through the server 1 between the HMDs 2-a and 2-c. In this way, the server 1 can acquire the exchange information of the HMDs 2-*a* to 2-*c* so as to determine, based on, for example, the information of the present positions of the HMDs 2-*a* to 2-*c*, that the related persons Ua and Uc are present within a constant range and that the related person Ub is present outside the constant range of the related persons Ua and Uc. In other words, the server 1 determines, for example, that the present positions of the related persons Ua and Uc and the related person Ub are, for example, the case of (2) "remote-local" or (3) "local-remote" shown in FIG. 19. Hence, as in the lower diagram of the b conditions shown in FIG. 24, the HMDs 2-*a* and 2-*c* worn by the related persons Ua and Uc receive the exchange information (such as the sound information and the avatar information) from the HMD 2-*b*, output the sound of the related person Ub, and arrange the avatar Ub' of the related person Ub. In this way, in the virtual spaces displayed in the display units 36 of the HMDs 2-*a* and 2-*c* worn by the related persons Ua and Uc, the 3D object and the like are arranged, the avatar Ub' of the related person Ub is also arranged, and the sound of the related person Ub is output from the sound input/output unit 42. Likewise, the HMD 2-*b* worn by the related person Ub receives the exchange information (such as the sound information and the avatar information) from the HMDs 2-*a* and 2-*c*, outputs the sound of the related persons Ua and Uc, and arranges the avatars Ua' and Uc' of the related persons Ua and Uc. In this way, in the virtual space displayed in the display unit 36 of the HMD 2-*b* worn by the related person Ub, the 3D object and the like are arranged, the avatars Ua' and Uc' of the related persons Ua and Uc are also arranged, and the sound of the related persons Ua and Uc is output from the sound input/output unit 42. In the HMDs 2-*a* and 2-*c* worn by the related persons Ua and Uc who are present in the same space, in the virtual spaces displayed in the display units 36, the avatars Ua' and Uc' of the related persons Ua and Uc are not arranged, and the sound of the related persons Ua and Uc is not output from the sound input/output unit 42.

In c conditions shown in FIG. 24, a relationship between the related persons Ua to Uc and the individual avatars thereof is indicated. Here, in the upper diagram of the c conditions shown in FIG. 24, a plurality of related persons U who perform the remote communication are equal in number to the avatars U' of the plurality of related persons. For example, the HMDs 2-*a* to 2-*c* worn by the related persons Ua to Uc arrange, based on the received avatar information, within the virtual space, the avatars Ua' to Uc' of the related persons Ua to Uc who are not present in the same space. In other words, in the virtual spaces displayed in the display units 36 of the HMDs 2-*a* to 2-*c* worn by the related persons Ua to Uc, the related persons Ua to Uc are arranged as the avatars, and the sound is output from the sound input/output unit 42, with the result that the related persons Ua to Uc can recognize each other as if they were present in the same space. In the lower diagram of the c conditions shown in FIG. 24, for example, when the related persons Ub and Uc move so as to switch the positions thereof, the arrangement of the avatar Ub' of the related person Ub in the virtual space which can be visually recognized by the related person Ua is switched. In other words, the processing unit 303 of the HMD 2-*a* of the related person Ua can acquire, through the communication unit 39, the avatar information of the related person Ub corresponding to the related person Ub after the movement so as to change, from the avatar information, the position of arrangement of the avatar in the virtual space displayed in the display unit 36. Hence, by the movement of the related person Ub, the position of arrangement of the avatar Ub' of the related person Ub is changed. In this way, even when the related persons Ub and Uc move so as to change the positions thereof, the related person Ua can recognize the change of the positions.

Figure 25:
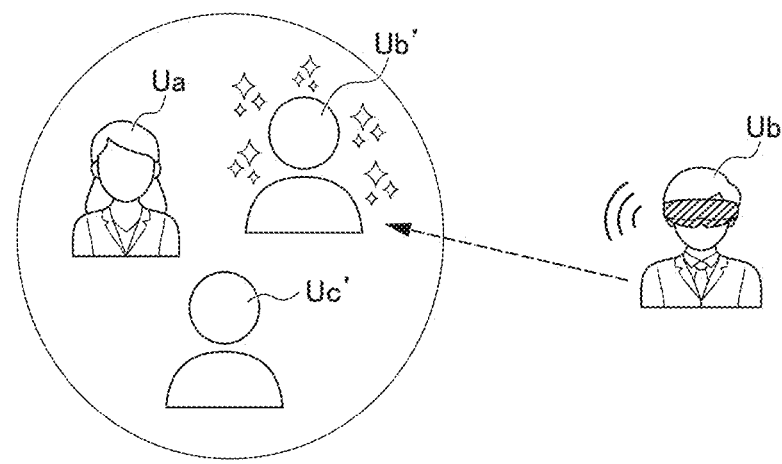
FIG. 25 is a diagram showing an example when a sound sender is recognized at the time of communication among the functions which can be realized in the information system according to the embodiment of the present invention.

FIG. 25 is a diagram showing, among functions which can be realized by the information system according to the embodiment of the present invention, an example when a sound sender is recognized at the time of communication.

In FIG. 25, in the virtual space displayed in the display unit 36 of the HMD 2-*a* worn by the related person Ua, the avatars Ub' and Uc' of the related persons Ub and Uc are arranged. When as shown in FIG. 25, a plurality of avatars are arranged in the virtual space displayed in the display unit 36 of the HMD 2-*a* worn by the related person Ua, the avatars are only visually recognized, and thus it is difficult for the related person Ua to identify which one of the related persons U has spoken. Hence, when the related person Ub is a person (hereinafter referred to as a "sound sender") who issues sound, for example, in a boundary (including an edge and a rim) between the avatar Ub' of the related person Ub and the virtual space, the avatar is flashed or the color or the like of the avatar is changed. Specifically, for example, as a method of flashing the avatar or changing the color or the like thereof, the HMD 2-*a* worn by the related person Ua acquires the sound information of the related person Ub through the server 1 and can flash the avatar Ub' of the related person Ub or change the color or the like thereof while acquiring the sound information. Specifically, when sound is issued from the related person Ub, the sound is input and converted into sound information in the sound input/output unit 42 of the HMD 2-*b* worn by the related person Ub, and the sound of the related person Ub is acquired as the sound information. The sound information described above is transmitted through the network N and the server 1 to the processing unit 303 of the HMD 2-*a* worn by the related person Ua. Then, for example, on the condition that the sound information is acquired, the display control unit 301 of the HMD 2-*a* worn by the related person Ua performs control such as for flashing the avatar of the related person Ub. Then, the avatar of the related person Ub can be displayed in the display unit 36 of the HMD 2-*a* of the related person Ua. In this way, the related person Ua can visually recognize the avatar Ub' of the related person Ub which is flashed or whose color is changed, and thus the related person Ua can identify the related person Ub as the sound sender. In this way, the related person Ua can recognize, with the avatar in the virtual space, which one of the related persons U is speaking, and thus it is possible to perform smooth communication. In the avatar, the name, the designation, or the like of the related person can also be displayed, making it possible to recognize who is speaking, with the result that it is possible to perform more smooth communication.

Figure 27:
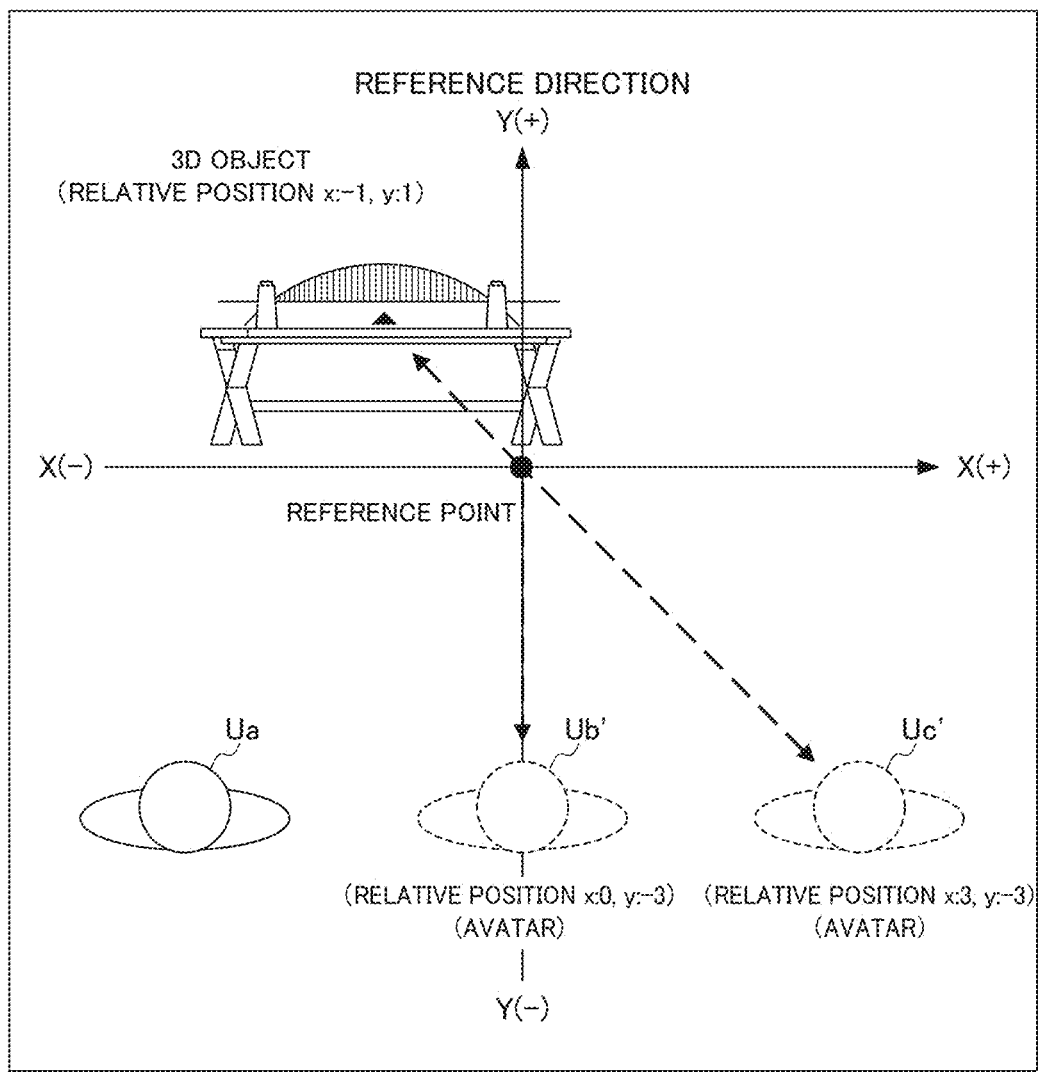
FIG. 27 is a diagram on a display object which is seen from a related person in an actual space.
Figure 28:
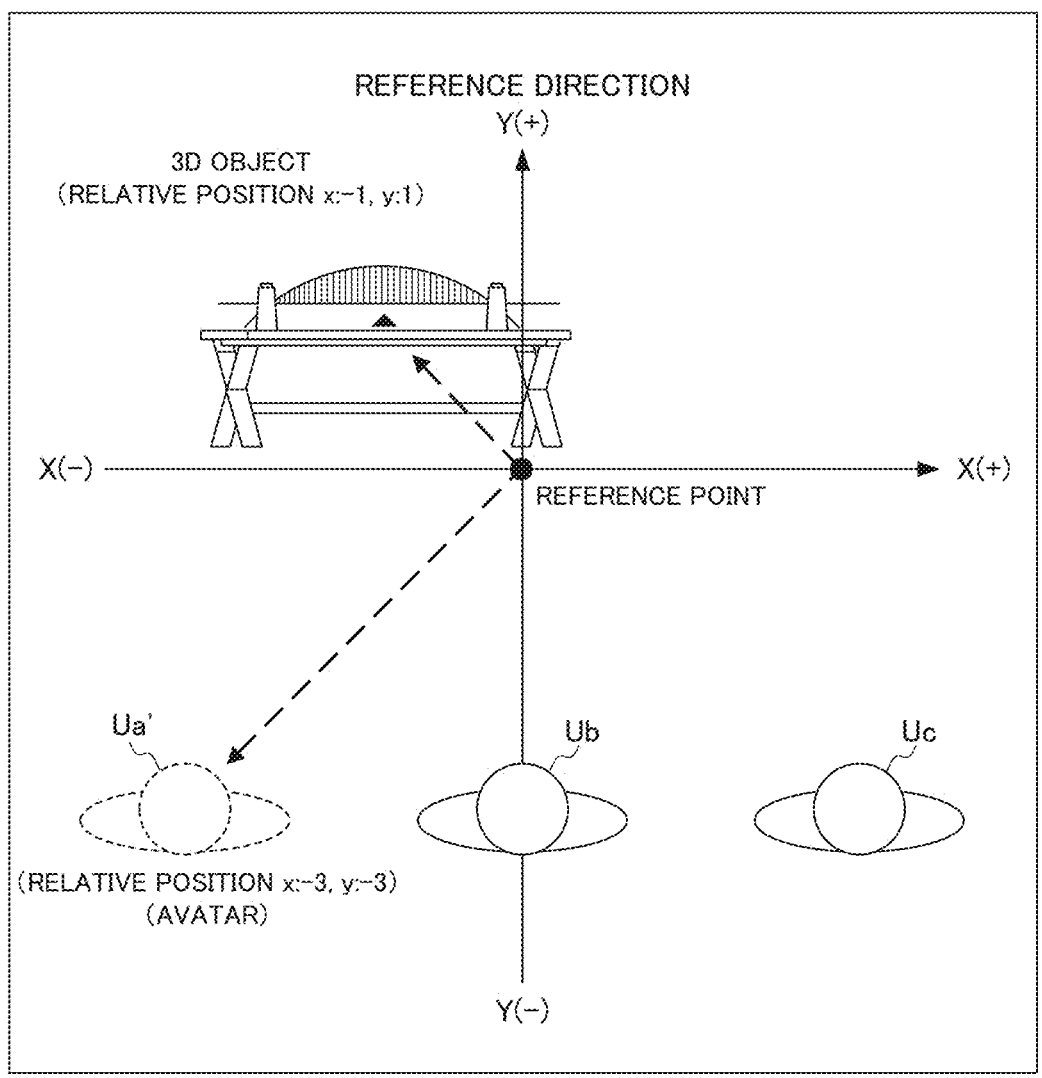
FIG. 28 is a diagram on the display object which is seen from the related person in the actual space.

Furthermore, the arrangement of avatars and the recognition of sound will be described in detail below with reference to FIG. 26 to FIG. 28.

Figure 26:
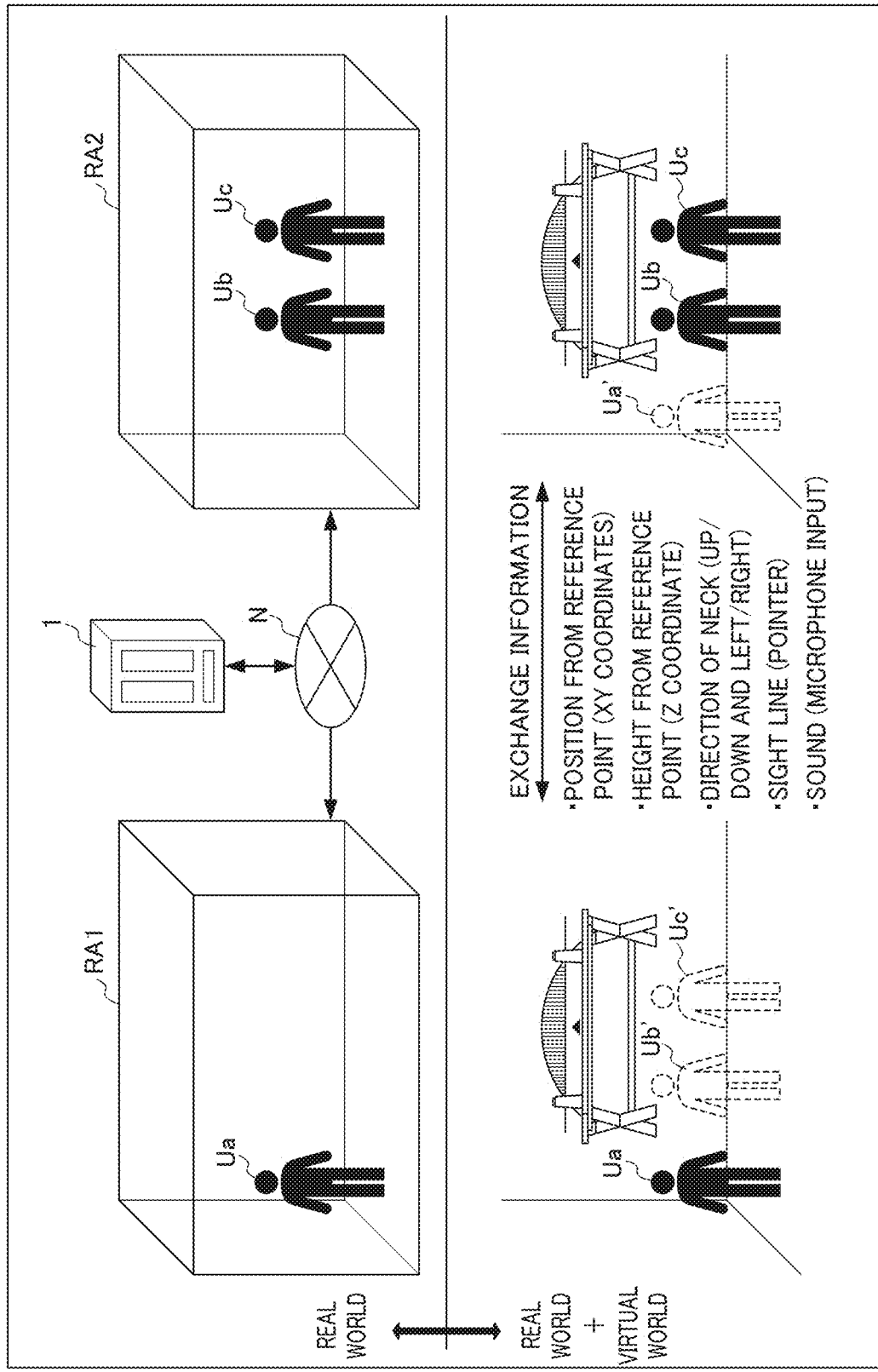
FIG. 26 is a diagram of a case where related persons are present in two or more different spaces.

FIG. 26 is a diagram of a case where related persons are present in two or more different actual spaces. In the example of FIG. 26, the related person Ua is present in an actual space RAI such as an office in a Tokyo headquarters, and the related persons Ub and Uc are present in an actual space RA2 such as an office in an Osaka branch. Although not shown in FIG. 26, each of the related persons Ua to Uc is wearing the HMD 2. The server 1 controls, through the network N, the HMDs 2-*a* to 2-*c* worn by the related persons Ua to Uc. For example, since the sound information and the avatar information of the related person Ua are transmitted from the HMD 2-*a* worn by the related person Ua, the server 1 transmits the sound information and the avatar information of the related person Ua to the HMDs 2-*b* and 2-*c* of other related persons U (in the example of FIG. 26, the related persons Ub and Uc). The avatar information and the sound information of each of the other related persons Ub and Uc are likewise transmitted to the HMDs 2 of the other related persons U. In this way, the avatar information and the sound information of the related persons Ua to Uc are shared in the HMDs 2-*a* to 2-*c* worn by the related persons Ua to Uc. Here, as shown in FIG. 26, the shared avatar information includes a position (X coordinate, Y coordinate) from the reference point, a height (Z coordinate) from the reference point, the direction of a neck (up/down and left/right directions), and a sight line (pointer) for the avatar within the virtual space. The sound information includes sound data (microphone input). The information on the position from the reference point described above is information which indicates, as coordinates (X, Y, Z), a relative distance from a predetermined position in the actual space to the HMD 2. Specifically, in the position information described above, the position from the reference point in the actual space to the HMD 2 is the coordinates (X, Y), and the height from the reference point in the actual space to the HMD 2 is the coordinate (Z). In other words, the sensor unit 37 of the HMD 2 arranges, based on the relative distance (coordinate position acquired in the actual space) from the reference point in the actual space to the HMD, the avatar in the position corresponding to the coordinates described above in the virtual space. The direction of the neck is information on the inclination of the HMD 2 acquired with the sensor unit 37 (for example, an accelerometer) of the HMD 2. Specifically, the sensor unit 37 acquires, when the neck of the related person using each of the HMDs 2 is inclined in the up/down direction and the left/right direction, a value on the inclination corresponding to the movement thereof. In the example of FIG. 26, in the HMD 2-*a* worn by the related person Ua present in the actual space RA1 and the HMDs 2-*b* and 2-*c* worn by the related persons Ub and Uc present in the actual space RA2, various types of information described above can be shared through the network N. In this way, the HMDs 2-*a* to 2-*c* can arrange, within the virtual space, the avatars corresponding to the positions and the like of the related persons.

A relationship between the reference point and various types of information acquired will be described next in more detail with reference to FIG. 27. FIG. 27 is a diagram on a display object when the display object is seen from the related person Ua in the actual space RA1. In the example of FIG. 27, as in the example of FIG. 26, it is assumed that only the related person Ua is present in the actual space RA1 and that the related persons Ub and Uc are present in the actual space RA2. When FIG. 27 is seen, it is indicated that the relative position of the 3D object is (x: −1, y: 1), the relative position of the avatar Ub' is (x: 0, y: −3), and the relative position of the avatar Uc' is (x: 3, y: −3). In other words, it is indicated that the positions (from the set reference point) within the virtual space in which the 3D object, the avatar Ub', and the avatar Uc' need to be arranged are the relative positions thereof. Here, as described above, the positions within the virtual space in which the avatar Ub' and the avatar Uc' need to be arranged are determined based on the positions (from the set reference point) of the related persons Ub and Uc present in the actual space RA2. Here, it is assumed that in each of the HMDs 2-*a* to 2-*c* worn by the related persons Ua to Uc, the 3D object is displayed in the relative position from the reference point, that is, the position of (x: −1, y: 1). Then, for example, the related person Ub visually recognizes, from an arbitrary position and an arbitrary angle, the 3D object displayed in this way. The HMD 2-*b* worn by the related person Ub transmits, as described above, through a network, the position information and the like corresponding to the movement of the related person Ub as described above to the HMD 2-*a* worn by the related person Ua and the like such that the avatar information such as the relative position of the related person Ub and the like can be shared. Then, in the HMD 2-*a* worn by the related person Ua, based on the shared relative position of the related person Ub, the avatar Ub' is arranged in a predetermined position within the virtual space.

As in FIG. 27, a relationship between the reference point and various types of information acquired will also be described in detail with reference to FIG. 28. FIG. 28 is a diagram on a display object when the display object is seen from the related persons Ua and Uc in the actual space RA2. In the example of FIG. 28, as in the example of FIG. 26, it is assumed that only the related person Ua is present in the actual space RA1 and that the related persons Ub and Uc are present in the actual space RA2. When FIG. 28 is seen, it is indicated that the relative position of the 3D object is (x: −1, y: 1) and the relative position of the avatar Ua' is (x: −3, y: −3). In other words, it is indicated that the positions (from the set reference point) within the virtual space in which the 3D object and the avatar Ua' need to be arranged are the relative positions thereof. Here, as described above, the position within the virtual space in which the avatar Ua' needs to be arranged is determined based on the position (from the set reference point) of the related person Ua present in the actual space RA1. Here, it is assumed that in each of the HMDs 2-*a* to 2-*c* worn by the related persons Ua to Uc, the 3D object is displayed in the relative position from the reference point, that is, the position of (x: −1, y: 1). Then, for example, the related person Ub visually recognizes, from an arbitrary position and an arbitrary angle, the 3D object displayed in this way. The HMD 2-*b* worn by the related person Ub transmits, as described above, through the network, the position information and the like corresponding to the movement of the related person Ub as described above to the HMD 2-*a* worn by the related person Ua and the like such that the avatar information such as the relative position of the related person Ub and the like can be shared. Then, in the HMDs 2-*b* and 2-*c* worn by the related persons Ub and Uc, based on the shared relative position of the related person Ua, the avatar Ua' is arranged in a predetermined position within the virtual space.

For example, although in the embodiments described above (in particular, the embodiment described with reference to FIG. 1 to FIG. 8), as the object arranged within the virtual space, the 3D object or the 3D model is adopted and described, there is no particular limitation to this configuration. In other words, the object is not limited to an object which is three-dimensionally formed, and, for example, an object which is two-dimensionally formed may be adopted.

As another example, although in the embodiments described above (in particular, the embodiment described with reference to FIG. 17, FIG. 22, and FIG. 28), the avatar and the 3D object are arranged within the virtual space, and thus communication is performed, there is no particular limitation to this configuration. In other words, there is no limitation to the avatar and the 3D object, and for example, necessary material data and document data may be arranged in the virtual space. Here, the HMD 2 worn by the related person U can store, as electronic data, the material data and the document data necessary for the remote communication described above in the document data DB 402. Then, the HMD 2 worn by the related person U extracts, from the document data DB 402, the document data which is desired to be arranged within the virtual space. The HMD 2 worn by the related person U can display, in the virtual space, the document data together with the avatars U' of the other related persons U and the 3D object. In this way, the related person U visualizes the 3D object, necessary data, and the like in the same virtual space, and thus checking and consultation using a large space can be performed.

For example, although in the embodiments described above, as the present service, the service is described as an example in which related persons in a predetermined construction project can check various types of work execution steps while experiencing, in a simulation, the state of the work execution of a structure serving as the target of the construction project, conditions at the time of completion, and the like, there is no particular limitation to this example. In other words, the information processing system according to the embodiment of the present invention can be applied to any applicable cases such as industries including not only construction project but also the manufacturing industry, the service industry, the financial industry, and the like.

For example, the series of processing steps described above can be performed by hardware or can be performed by software. In other words, the functional configurations of FIG. 7 and FIG. 18 are simply illustrative and not restrictive, and there is no particular limitation. Specifically, as long as a function capable of performing the series of processing steps described above as a whole is included in the information processing system, the types of functional blocks are used for realizing this function are not particularly limited to the example of FIG. 2. The places of presence of the functional blocks are also not particularly limited to FIG. 7 and FIG. 18 and may be arbitrarily determined. Specifically, for example, the three-dimensional data DB 401, the document data DB 402, and the time attribute definition DB 403 stored in the storage unit 38 of FIG. 18 may be stored in the storage unit 18 of the server 1. The processing unit 303 may also be present in the server 1. One functional block may be formed by hardware alone, may be formed by software alone, or may be formed by a combination thereof For example, when the series of processing steps are performed by software, programs which form the software are installed into a computer or the like from a network or a recording medium. The computer may be a computer which is incorporated in dedicated hardware. The computer may be a computer which can perform various types of functions by installing various types of programs, for example, a server, a general-purpose smartphone, or a personal computer.

For example, the recording medium including the programs is formed not only with an unillustrated removable medium which is distributed separately from a device main body in order to provide the programs to a user but also with a recording medium or the like which is provided to the user in a state where it is incorporated in the device main body in advance.

In the present specification, steps for describing the programs recorded in the recording medium naturally include processing which is chronologically performed along the order thereof and also include processing which is not necessarily chronologically processed but is performed parallel or individually. In the present specification, the term of the system means a general device which is formed with a plurality of devices, a plurality of means, and the like.

EXPLANATION OF REFERENCE NUMERALS

1: server, 2: HMD, 3: controller, 11: CPU, 18: storage unit, 36: display unit, 37: sensor unit, 42: sound input/output unit, 100: time information acquisition unit, 101: object arrangement unit, 102: viewpoint information acquisition unit, 103: viewpoint management unit, 104: virtual space establishment unit, 105: display image generation unit, 106: display control unit, 303: processing unit, 401: three-dimensional data DB, 402: document data DB, 403: time attribute definition DB, 500: object DB

The invention claimed is:

1. An information processing device comprising:
    an arrangement section that arranges, in a three-dimensional virtual space, an object corresponding to an actual object whose state is changed in a direction of at least one or more dimensions among n dimensions (n is an integer value of 2 or more);
    a coordinate acquisition section that acquires a coordinate in the at least one or more dimensions in which the state is changed among the n dimensions;
    an image generation section that generates data of an image in which the object corresponding to the actual object in a state at the acquired coordinate in the at least one or more dimensions can be visually recognized from a predetermined viewpoint in the virtual space where the object is arranged by the arrangement section, and
    a display unit which displays an icon in a slider which is movable by a user and shows the state at a predetermined point,
    wherein among the n dimensions, the at least one or more dimensions in which the state is changed is in a time direction,
    the actual object is a structure which is constructed within a predetermined period,
    the coordinate acquisition section acquires a predetermined time within the predetermined period as a coordinate in the time direction,
    the image generation section generates data of an image in which the object corresponding to the actual object in a state of being under construction or in a state after construction at the acquired predetermined time can be seen from the predetermined viewpoint in the virtual space where the object is arranged by the arrangement section, and
    the image generation section generates data of a document relating to any of check, inspection, and management regarding the structure, for displaying the document on the display unit.

2. The information processing device according to claim 1, further comprising: a viewpoint acquisition section which acquires a predetermined viewpoint of a user within the virtual space,
    wherein the image generation section generates data of an image that can be seen from the viewpoint acquired with the viewpoint acquisition section.

3. The information processing device according to claim 1, wherein layers are individually defined for a part of the actual object or a unit associated therewith,
    a period during which the part or the unit can be present in the virtual space is made to correspond to each of the layers in the time direction, and the image generation section generates data of the image in which among the layers, a layer corresponding to the period including the acquired predetermined time can be seen from the predetermined viewpoint in the virtual space where the object is arranged by the arrangement section.

4. The information processing device according to claim 1, wherein the display unit displays a process chart indicating work execution steps of the structure together with the slider, and moves the icon of the slider to specify a predetermined time on a time axis in the process chart.

5. The information processing device according to claim 1, wherein the image generation section includes data of the image that can be enlarged or shrunk, for simulating the construction work of the structure, and generates data of the image for viewing the object in actual-size, the data of the image enables a simulation of arranging a real-sized person or an actual-size construction machine and contacting the object in the image as needed.

6. An information processing method which is performed by an information processing device, the information processing method comprising:
   arranging, in a three-dimensional virtual space, an object corresponding to an actual object whose state is changed in a direction of at least one or more dimensions among n dimensions (n is an integer value of 2 or more);
   acquiring a coordinate in the at least one or more dimensions in which the state is changed among the n dimensions;
   generating data of an image in which the object corresponding to the actual object in a state at the acquired coordinate in the at least one or more dimensions can be visually recognized from a predetermined viewpoint in the virtual space where the object is arranged in the arranging the object; and
   displaying an icon in a slider which is movable by a user and shows the state at a predetermined point,
   wherein among the n dimensions, the at least one or more dimensions in which the state is changed is in a time direction,
   the actual object is a structure which is constructed within a predetermined period,
   a predetermined time is acquired within the predetermined period as a coordinate in the time direction,
   data of an image in which the object corresponding to the actual object in a state of being under construction or in a state after construction at the acquired predetermined time can be seen from the predetermined viewpoint in the virtual space where the object is arranged is generated, and
   data of a document relating to any of check, inspection, and management regarding the structure is generated for displaying the document on the display unit.

7. A non-transitory computer readable medium storing a program which instructs a computer to execute control processing, the control processing comprising:
   arranging, in a three-dimensional virtual space, an object corresponding to an actual object whose state is changed in a direction of at least one or more dimensions among n dimensions (n is an integer value of 2 or more);
   acquiring a coordinate in the at least one or more dimensions in which the state is changed among the n dimensions;
   generating data of an image in which the object corresponding to the actual object in a state at the acquired coordinate in the at least one or more dimensions can be visually recognized from a predetermined viewpoint in the virtual space where the object is arranged in the arranging the object; and
   displaying an icon in a slider which is movable by a user and shows the state at a predetermined point,
   wherein among the n dimensions, the at least one or more dimensions in which the state is changed is in a time direction,
   the actual object is a structure which is constructed within a predetermined period,
   a predetermined time is acquired within the predetermined period as a coordinate in the time direction,
   data of an image in which the object corresponding to the actual object in a state of being under construction or in a state after construction at the acquired predetermined time can be seen from the predetermined viewpoint in the virtual space where the object is arranged is generated, and
   data of a document relating to any of check, inspection, and management regarding the structure is generated for displaying the document on the display unit.

\* \* \* \* \*